(12) United States Patent
Hoffmann et al.

(10) Patent No.: US 8,629,016 B1
(45) Date of Patent: Jan. 14, 2014

(54) MULTIPLE TRANSISTOR TYPES FORMED IN A COMMON EPITAXIAL LAYER BY DIFFERENTIAL OUT-DIFFUSION FROM A DOPED UNDERLAYER

(75) Inventors: Thomas Hoffmann, San Jose, CA (US);
Pushkar Ranade, Los Gatos, CA (US);
Lucian Shifren, San Jose, CA (US);
Scott E. Thompson, Gainesville, FL (US)

(73) Assignee: SuVolta, Inc., Los Gatos, CA (US)

( * ) Notice: Subject to any disclaimer, the term of this patent is extended or adjusted under 35 U.S.C. 154(b) by 0 days.

(21) Appl. No.: 13/459,971

(22) Filed: Apr. 30, 2012

Related U.S. Application Data

(60) Provisional application No. 61/511,923, filed on Jul. 26, 2011.

(51) Int. Cl.
*H01L 21/8238* (2006.01)

(52) U.S. Cl.
USPC .......... 438/199; 438/289; 438/300; 438/514; 438/530; 257/E21.633; 257/E21.335; 257/369; 257/192; 257/E21.409

(58) Field of Classification Search
USPC ............... 257/E21.633, E21.335, 369, 192, 257/E21.409, E29.055; 438/199, 289, 300, 438/514, 530
See application file for complete search history.

(56) References Cited

U.S. PATENT DOCUMENTS

| | | | |
|---|---|---|---|
| 3,958,266 A | 5/1976 | Athanas | |
| 4,000,504 A | 12/1976 | Berger | |
| 4,021,835 A | 5/1977 | Etoh et al. | |
| 4,242,691 A | 12/1980 | Kotani et al. | |
| 4,276,095 A | 6/1981 | Beilstein, Jr. et al. | |
| 4,315,781 A | 2/1982 | Henderson | |
| 4,518,926 A | 5/1985 | Swanson | |
| 4,559,091 A | 12/1985 | Allen et al. | |
| 4,578,128 A | 3/1986 | Mundt et al. | |
| 4,617,066 A | 10/1986 | Vasudev | |
| 4,662,061 A | 5/1987 | Malhi | |
| 4,761,384 A | 8/1988 | Neppl et al. | |

(Continued)

FOREIGN PATENT DOCUMENTS

| EP | 0274278 | 7/1988 |
|---|---|---|
| EP | 0312237 | 4/1989 |

(Continued)

OTHER PUBLICATIONS

Abiko, H et al.,"A Channel Engineering Combined with Channel Epitaxy Optimization and TED Suppression for 0.15 μm n-n Gate CMOS Technology", 1995 Symposium on VLSI Technology Digest of Technical Papers, pp. 23-24 (1995).

(Continued)

*Primary Examiner* — Zandra Smith
*Assistant Examiner* — Paul Patton
(74) *Attorney, Agent, or Firm* — Sterne, Kessler, Goldstein & Fox P.L.L.C.

(57) ABSTRACT

Multiple transistor types are formed in a common epitaxial layer by differential out-diffusion from a doped underlayer. Differential out-diffusion affects the thickness of a FET channel, the doping concentration in the FET channel, and distance between the gate dielectric layer and the doped underlayer. Differential out-diffusion may be achieved by differentially applying a dopant migration suppressor such as carbon; differentially doping the underlayer with two or more dopants having the same conductivity type but different diffusivities; and/or differentially applying thermal energy.

15 Claims, 7 Drawing Sheets

(56) References Cited

U.S. PATENT DOCUMENTS

| | | | |
|---|---|---|---|
| 4,780,748 | A | 10/1988 | Cunningham et al. |
| 4,819,043 | A | 4/1989 | Yazawa et al. |
| 4,885,477 | A | 12/1989 | Bird et al. |
| 4,908,681 | A | 3/1990 | Nishida et al. |
| 4,945,254 | A | 7/1990 | Robbins |
| 4,956,311 | A | 9/1990 | Liou et al. |
| 5,034,337 | A | 7/1991 | Mosher et al. |
| 5,091,324 | A | 2/1992 | Hsu et al. |
| 5,144,378 | A | 9/1992 | Hikosaka |
| 5,156,989 | A | 10/1992 | Williams et al. |
| 5,156,990 | A | 10/1992 | Mitchell |
| 5,166,765 | A | 11/1992 | Lee et al. |
| 5,208,473 | A | 5/1993 | Komori et al. |
| 5,294,821 | A | 3/1994 | Iwamatsu |
| 5,298,763 | A | 3/1994 | Shen et al. |
| 5,369,288 | A | 11/1994 | Usuki |
| 5,373,186 | A | 12/1994 | Schubert et al. |
| 5,384,476 | A | 1/1995 | Nishizawa et al. |
| 5,426,328 | A | 6/1995 | Yilmaz et al. |
| 5,444,008 | A | 8/1995 | Han et al. |
| 5,552,332 | A | 9/1996 | Tseng et al. |
| 5,559,368 | A | 9/1996 | Hu et al. |
| 5,608,253 | A | 3/1997 | Liu et al. |
| 5,622,880 | A | 4/1997 | Burr et al. |
| 5,624,863 | A | 4/1997 | Helm et al. |
| 5,625,568 | A | 4/1997 | Edwards et al. |
| 5,641,980 | A | 6/1997 | Yamaguchi et al. |
| 5,663,583 | A | 9/1997 | Matloubian et al. |
| 5,712,501 | A | 1/1998 | Davies et al. |
| 5,719,422 | A | 2/1998 | Burr et al. |
| 5,726,488 | A | 3/1998 | Watanabe et al. |
| 5,726,562 | A | 3/1998 | Mizuno |
| 5,731,626 | A | 3/1998 | Eaglesham et al. |
| 5,736,419 | A | 4/1998 | Naem |
| 5,753,555 | A | 5/1998 | Hada |
| 5,754,826 | A | 5/1998 | Gamal et al. |
| 5,756,365 | A | 5/1998 | Kakumu |
| 5,763,921 | A | 6/1998 | Okumura et al. |
| 5,780,899 | A | 7/1998 | Hu et al. |
| 5,847,419 | A | 12/1998 | Imai et al. |
| 5,856,003 | A | 1/1999 | Chiu |
| 5,861,334 | A | 1/1999 | Rho |
| 5,877,049 | A | 3/1999 | Liu et al. |
| 5,885,876 | A | 3/1999 | Dennen |
| 5,889,315 | A | 3/1999 | Farrenkopf et al. |
| 5,895,954 | A | 4/1999 | Yasumura et al. |
| 5,899,714 | A | 5/1999 | Farrenkopf et al. |
| 5,918,129 | A | 6/1999 | Fulford, Jr. et al. |
| 5,923,067 | A | 7/1999 | Voldman |
| 5,923,987 | A | 7/1999 | Burr |
| 5,936,868 | A | 8/1999 | Hall |
| 5,946,214 | A | 8/1999 | Heavlin et al. |
| 5,985,705 | A | 11/1999 | Seliskar |
| 5,989,963 | A | 11/1999 | Luning et al. |
| 6,001,695 | A | 12/1999 | Wu |
| 6,020,227 | A | 2/2000 | Bulucea |
| 6,030,862 | A | 2/2000 | Kepler |
| 6,043,139 | A | 3/2000 | Eaglesham et al. |
| 6,060,345 | A | 5/2000 | Hause et al. |
| 6,060,364 | A | 5/2000 | Maszara et al. |
| 6,066,533 | A | 5/2000 | Yu |
| 6,072,217 | A | 6/2000 | Burr |
| 6,078,082 | A | 6/2000 | Bulucea |
| 6,087,210 | A | 7/2000 | Sohn |
| 6,087,691 | A | 7/2000 | Hamamoto |
| 6,088,518 | A | 7/2000 | Hsu |
| 6,091,286 | A | 7/2000 | Blauschild |
| 6,096,611 | A | 8/2000 | Wu |
| 6,103,562 | A | 8/2000 | Son et al. |
| 6,121,153 | A | 9/2000 | Kikkawa |
| 6,147,383 | A | 11/2000 | Kuroda |
| 6,153,920 | A | 11/2000 | Gossmann et al. |
| 6,157,073 | A | 12/2000 | Lehongres |
| 6,175,582 | B1 | 1/2001 | Naito et al. |
| 6,184,112 | B1 | 2/2001 | Maszara et al. |
| 6,190,979 | B1 | 2/2001 | Radens et al. |
| 6,194,259 | B1 | 2/2001 | Nayak et al. |
| 6,198,157 | B1 | 3/2001 | Ishida et al. |
| 6,218,892 | B1 | 4/2001 | Soumyanath et al. |
| 6,218,895 | B1 | 4/2001 | De et al. |
| 6,221,724 | B1 | 4/2001 | Yu et al. |
| 6,229,188 | B1 | 5/2001 | Aoki et al. |
| 6,232,164 | B1 | 5/2001 | Tsai et al. |
| 6,235,597 | B1 | 5/2001 | Miles |
| 6,238,982 | B1 | 5/2001 | Krivokapic et al. |
| 6,245,618 | B1 | 6/2001 | An et al. |
| 6,255,174 | B1 | 7/2001 | Yu |
| 6,268,640 | B1 | 7/2001 | Park et al. |
| 6,271,070 | B2 | 8/2001 | Kotani et al. |
| 6,271,551 | B1 | 8/2001 | Schmitz et al. |
| 6,288,429 | B1 | 9/2001 | Iwata et al. |
| 6,297,082 | B1 | 10/2001 | Lin et al. |
| 6,297,132 | B1 | 10/2001 | Zhang et al. |
| 6,300,177 | B1 | 10/2001 | Sundaresan et al. |
| 6,313,489 | B1 | 11/2001 | Letavic et al. |
| 6,319,799 | B1 | 11/2001 | Ouyang et al. |
| 6,320,222 | B1 | 11/2001 | Forbes et al. |
| 6,323,525 | B1 | 11/2001 | Noguchi et al. |
| 6,326,666 | B1 | 12/2001 | Bernstein et al. |
| 6,335,233 | B1 | 1/2002 | Cho et al. |
| 6,358,806 | B1 | 3/2002 | Puchner |
| 6,380,019 | B1 | 4/2002 | Yu et al. |
| 6,391,752 | B1 | 5/2002 | Colinge et al. |
| 6,426,260 | B1 | 7/2002 | Hshieh |
| 6,426,279 | B1 | 7/2002 | Huster et al. |
| 6,432,754 | B1 | 8/2002 | Assaderaghi et al. |
| 6,444,550 | B1 | 9/2002 | Hao et al. |
| 6,444,551 | B1 | 9/2002 | Ku et al. |
| 6,449,749 | B1 | 9/2002 | Stine |
| 6,455,903 | B1 | 9/2002 | Yu |
| 6,461,920 | B1 | 10/2002 | Shirahata |
| 6,461,928 | B2 | 10/2002 | Rodder |
| 6,472,278 | B1 | 10/2002 | Marshall et al. |
| 6,482,714 | B1 | 11/2002 | Hieda et al. |
| 6,489,224 | B1 | 12/2002 | Burr |
| 6,492,232 | B1 | 12/2002 | Tang et al. |
| 6,500,739 | B1 | 12/2002 | Wang et al. |
| 6,503,801 | B1 | 1/2003 | Rouse et al. |
| 6,503,805 | B1 | 1/2003 | Wang et al. |
| 6,506,640 | B1 | 1/2003 | Ishida et al. |
| 6,518,623 | B1 | 2/2003 | Oda et al. |
| 6,521,470 | B1 | 2/2003 | Lin et al. |
| 6,534,373 | B1 | 3/2003 | Yu |
| 6,541,328 | B2 | 4/2003 | Whang et al. |
| 6,541,829 | B2 | 4/2003 | Nishinohara et al. |
| 6,548,842 | B1 | 4/2003 | Bulucea et al. |
| 6,551,885 | B1 | 4/2003 | Yu |
| 6,552,377 | B1 | 4/2003 | Yu |
| 6,573,129 | B2 | 6/2003 | Hoke et al. |
| 6,576,535 | B2 | 6/2003 | Drobny et al. |
| 6,600,200 | B1 | 7/2003 | Lustig et al. |
| 6,620,671 | B1 | 9/2003 | Wang et al. |
| 6,624,488 | B1 | 9/2003 | Kim |
| 6,627,473 | B1 | 9/2003 | Oikawa et al. |
| 6,630,385 | B1 | 10/2003 | Yu |
| 6,630,710 | B1 | 10/2003 | Augusto |
| 6,660,605 | B1 | 12/2003 | Liu |
| 6,662,350 | B2 | 12/2003 | Fried et al. |
| 6,667,200 | B2 | 12/2003 | Sohn et al. |
| 6,670,260 | B1 | 12/2003 | Yu et al. |
| 6,693,333 | B1 | 2/2004 | Yu |
| 6,730,568 | B2 | 5/2004 | Sohn |
| 6,737,724 | B2 | 5/2004 | Hieda et al. |
| 6,743,291 | B2 | 6/2004 | Ang et al. |
| 6,743,684 | B2 | 6/2004 | Liu |
| 6,751,519 | B1 | 6/2004 | Satya et al. |
| 6,753,230 | B2 * | 6/2004 | Sohn et al. .................. 438/289 |
| 6,760,900 | B2 | 7/2004 | Rategh et al. |
| 6,770,944 | B2 | 8/2004 | Nishinohara et al. |
| 6,787,424 | B1 | 9/2004 | Yu |
| 6,797,553 | B2 | 9/2004 | Adkisson et al. |
| 6,797,602 | B1 | 9/2004 | Kluth et al. |
| 6,797,994 | B1 | 9/2004 | Hoke et al. |
| 6,808,004 | B2 | 10/2004 | Kamm et al. |

(56) References Cited

U.S. PATENT DOCUMENTS

| | | |
|---|---|---|
| 6,808,994 B1 | 10/2004 | Wang |
| 6,813,750 B2 | 11/2004 | Usami et al. |
| 6,821,825 B2 | 11/2004 | Todd et al. |
| 6,821,852 B2 | 11/2004 | Rhodes |
| 6,822,297 B2 | 11/2004 | Nandakumar et al. |
| 6,831,292 B2 | 12/2004 | Currie et al. |
| 6,835,639 B2 | 12/2004 | Rotondaro et al. |
| 6,852,602 B2 | 2/2005 | Kanzawa et al. |
| 6,852,603 B2 | 2/2005 | Chakravarthi et al. |
| 6,881,641 B2 | 4/2005 | Wieczorek et al. |
| 6,881,987 B2 | 4/2005 | Sohn |
| 6,891,439 B2 | 5/2005 | Jachne et al. |
| 6,893,947 B2 | 5/2005 | Martinez et al. |
| 6,900,519 B2 | 5/2005 | Cantell et al. |
| 6,901,564 B2 | 5/2005 | Stine et al. |
| 6,916,698 B2 | 7/2005 | Mocuta et al. |
| 6,917,237 B1 | 7/2005 | Tschanz et al. |
| 6,927,463 B2 | 8/2005 | Iwata et al. |
| 6,928,128 B1 | 8/2005 | Sidiropoulos |
| 6,930,007 B2 | 8/2005 | Bu et al. |
| 6,930,360 B2 | 8/2005 | Yamauchi et al. |
| 6,957,163 B2 | 10/2005 | Ando |
| 6,963,090 B2 | 11/2005 | Passlack et al. |
| 6,995,397 B2 | 2/2006 | Yamashita et al. |
| 7,002,214 B1 | 2/2006 | Boyd et al. |
| 7,008,836 B2 | 3/2006 | Algotsson et al. |
| 7,013,359 B1 | 3/2006 | Li |
| 7,015,546 B2 | 3/2006 | Herr et al. |
| 7,015,741 B2 | 3/2006 | Tschanz et al. |
| 7,022,559 B2 | 4/2006 | Barnak et al. |
| 7,036,098 B2 | 4/2006 | Eleyan et al. |
| 7,038,258 B2 | 5/2006 | Liu et al. |
| 7,039,881 B2 | 5/2006 | Regan |
| 7,045,456 B2 | 5/2006 | Murto et al. |
| 7,057,216 B2 | 6/2006 | Ouyang et al. |
| 7,061,058 B2 | 6/2006 | Chakravarthi et al. |
| 7,064,039 B2 | 6/2006 | Liu |
| 7,064,399 B2 | 6/2006 | Babcock et al. |
| 7,071,103 B2 | 7/2006 | Chan et al. |
| 7,078,325 B2 | 7/2006 | Curello et al. |
| 7,078,776 B2 | 7/2006 | Nishinohara et al. |
| 7,089,513 B2 | 8/2006 | Bard et al. |
| 7,089,515 B2 | 8/2006 | Hanafi et al. |
| 7,091,093 B1 | 8/2006 | Noda et al. |
| 7,105,399 B1 | 9/2006 | Dakshina-Murthy et al. |
| 7,109,099 B2 | 9/2006 | Tan et al. |
| 7,119,381 B2 | 10/2006 | Passlack |
| 7,122,411 B2 | 10/2006 | Mouli |
| 7,127,687 B1 | 10/2006 | Signore |
| 7,132,323 B2 | 11/2006 | Haensch et al. |
| 7,169,675 B2 | 1/2007 | Tan et al. |
| 7,170,120 B2 | 1/2007 | Datta et al. |
| 7,176,137 B2 | 2/2007 | Perng et al. |
| 7,186,598 B2 | 3/2007 | Yamauchi et al. |
| 7,189,627 B2 | 3/2007 | Wu et al. |
| 7,199,430 B2 | 4/2007 | Babcock et al. |
| 7,202,517 B2 | 4/2007 | Dixit et al. |
| 7,208,354 B2 | 4/2007 | Bauer |
| 7,211,871 B2 | 5/2007 | Cho |
| 7,221,021 B2 | 5/2007 | Wu et al. |
| 7,223,646 B2 | 5/2007 | Miyashita et al. |
| 7,226,833 B2 | 6/2007 | White et al. |
| 7,226,843 B2 | 6/2007 | Weber et al. |
| 7,230,680 B2 | 6/2007 | Fujisawa et al. |
| 7,235,822 B2 | 6/2007 | Li |
| 7,256,639 B1 | 8/2007 | Koniaris et al. |
| 7,259,428 B2 | 8/2007 | Inaba |
| 7,260,562 B2 | 8/2007 | Czajkowski et al. |
| 7,294,877 B2 | 11/2007 | Rueckes et al. |
| 7,297,994 B2 | 11/2007 | Wieczorek et al. |
| 7,301,208 B2 | 11/2007 | Handa et al. |
| 7,304,350 B2 | 12/2007 | Misaki |
| 7,307,471 B2 | 12/2007 | Gammie et al. |
| 7,312,500 B2 | 12/2007 | Miyashita et al. |
| 7,323,754 B2 | 1/2008 | Ema et al. |
| 7,332,439 B2 | 2/2008 | Lindert et al. |
| 7,348,629 B2 | 3/2008 | Chu et al. |
| 7,354,833 B2 | 4/2008 | Liaw |
| 7,361,562 B2 | 4/2008 | Kim |
| 7,380,225 B2 | 5/2008 | Joshi et al. |
| 7,398,497 B2 | 7/2008 | Sato et al. |
| 7,402,207 B1 | 7/2008 | Besser et al. |
| 7,402,872 B2 | 7/2008 | Murthy et al. |
| 7,416,605 B2 | 8/2008 | Zollner et al. |
| 7,427,788 B2 | 9/2008 | Li et al. |
| 7,442,971 B2 | 10/2008 | Wirbeleit et al. |
| 7,449,733 B2 | 11/2008 | Inaba et al. |
| 7,462,908 B2 | 12/2008 | Bol et al. |
| 7,469,164 B2 | 12/2008 | Du-Nour |
| 7,470,593 B2 | 12/2008 | Rouh et al. |
| 7,485,536 B2 | 2/2009 | Jin et al. |
| 7,487,474 B2 | 2/2009 | Ciplickas et al. |
| 7,491,988 B2 | 2/2009 | Tolchinsky et al. |
| 7,494,861 B2 | 2/2009 | Chu et al. |
| 7,496,862 B2 | 2/2009 | Chang et al. |
| 7,496,867 B2 | 2/2009 | Turner et al. |
| 7,498,637 B2 | 3/2009 | Yamaoka et al. |
| 7,501,324 B2 | 3/2009 | Babcock et al. |
| 7,503,020 B2 | 3/2009 | Allen et al. |
| 7,507,999 B2 | 3/2009 | Kusumoto et al. |
| 7,514,766 B2 | 4/2009 | Yoshida |
| 7,521,323 B2 | 4/2009 | Surdeanu et al. |
| 7,531,393 B2 | 5/2009 | Doyle et al. |
| 7,531,836 B2 | 5/2009 | Liu et al. |
| 7,538,364 B2 | 5/2009 | Twynam |
| 7,538,412 B2 | 5/2009 | Schulze et al. |
| 7,562,233 B1 | 7/2009 | Sheng et al. |
| 7,564,105 B2 | 7/2009 | Chi et al. |
| 7,566,600 B2 | 7/2009 | Mouli |
| 7,569,456 B2 | 8/2009 | Ko et al. |
| 7,586,322 B1 | 9/2009 | Xu et al. |
| 7,592,241 B2 | 9/2009 | Takao |
| 7,595,243 B1 | 9/2009 | Bulucea et al. |
| 7,598,142 B2 | 10/2009 | Ranade et al. |
| 7,605,041 B2 | 10/2009 | Ema et al. |
| 7,605,060 B2 | 10/2009 | Meunier-Beillard et al. |
| 7,605,429 B2 | 10/2009 | Bernstein et al. |
| 7,608,496 B2 | 10/2009 | Chu |
| 7,615,802 B2 | 11/2009 | Elpelt et al. |
| 7,622,341 B2 | 11/2009 | Chudzik et al. |
| 7,638,380 B2 | 12/2009 | Pearce |
| 7,642,140 B2 | 1/2010 | Bae et al. |
| 7,644,377 B1 | 1/2010 | Saxe et al. |
| 7,645,665 B2 | 1/2010 | Kubo et al. |
| 7,651,920 B2 | 1/2010 | Siprak |
| 7,655,523 B2 | 2/2010 | Babcock et al. |
| 7,673,273 B2 | 3/2010 | Madurawe et al. |
| 7,675,126 B2 | 3/2010 | Cho |
| 7,675,317 B2 | 3/2010 | Perisetty |
| 7,678,638 B2 | 3/2010 | Chu et al. |
| 7,681,628 B2 | 3/2010 | Joshi et al. |
| 7,682,887 B2 | 3/2010 | Dokumaci et al. |
| 7,683,442 B1 | 3/2010 | Burr et al. |
| 7,696,000 B2 | 4/2010 | Liu et al. |
| 7,704,822 B2 | 4/2010 | Jeong |
| 7,704,844 B2 | 4/2010 | Zhu et al. |
| 7,709,828 B2 | 5/2010 | Braithwaite et al. |
| 7,723,750 B2 | 5/2010 | Zhu et al. |
| 7,732,286 B2 | 6/2010 | Hanafi et al. |
| 7,737,472 B2 | 6/2010 | Kondo et al. |
| 7,741,138 B2 | 6/2010 | Cho |
| 7,741,200 B2 | 6/2010 | Cho et al. |
| 7,745,270 B2 | 6/2010 | Shah et al. |
| 7,750,374 B2 | 7/2010 | Capasso et al. |
| 7,750,381 B2 | 7/2010 | Hokazono et al. |
| 7,750,405 B2 | 7/2010 | Nowak |
| 7,750,682 B2 | 7/2010 | Bernstein et al. |
| 7,755,144 B2 | 7/2010 | Li et al. |
| 7,755,146 B2 | 7/2010 | Helm et al. |
| 7,759,206 B2 | 7/2010 | Luo et al. |
| 7,759,714 B2 | 7/2010 | Itoh et al. |
| 7,761,820 B2 | 7/2010 | Berger et al. |
| 7,795,677 B2 | 9/2010 | Bangsaruntip et al. |
| 7,808,045 B2 | 10/2010 | Kawahara et al. |

(56) References Cited

U.S. PATENT DOCUMENTS

| | | |
|---|---|---|
| 7,808,410 B2 | 10/2010 | Kim et al. |
| 7,811,873 B2 | 10/2010 | Mochizuki |
| 7,811,881 B2 | 10/2010 | Cheng et al. |
| 7,818,702 B2 | 10/2010 | Mandelman et al. |
| 7,821,066 B2 | 10/2010 | Lebby et al. |
| 7,829,402 B2 | 11/2010 | Matocha et al. |
| 7,829,957 B2 | 11/2010 | Kato et al. |
| 7,831,873 B1 | 11/2010 | Trimberger et al. |
| 7,846,822 B2 | 12/2010 | Seebauer et al. |
| 7,855,118 B2 | 12/2010 | Hoentschel et al. |
| 7,859,013 B2 | 12/2010 | Chen et al. |
| 7,863,163 B2 | 1/2011 | Bauer |
| 7,867,835 B2 | 1/2011 | Lee et al. |
| 7,883,977 B2 | 2/2011 | Babcock et al. |
| 7,888,205 B2 | 2/2011 | Herner et al. |
| 7,888,747 B2 | 2/2011 | Hokazono |
| 7,895,546 B2 | 2/2011 | Lahner et al. |
| 7,897,495 B2 | 3/2011 | Ye et al. |
| 7,906,413 B2 | 3/2011 | Cardone et al. |
| 7,906,813 B2 | 3/2011 | Kato |
| 7,910,419 B2 | 3/2011 | Fenouillet-Beranger et al. |
| 7,919,791 B2 | 4/2011 | Flynn et al. |
| 7,926,018 B2 | 4/2011 | Moroz et al. |
| 7,935,984 B2 | 5/2011 | Nakano |
| 7,939,898 B2 | 5/2011 | Smayling et al. |
| 7,941,776 B2 | 5/2011 | Majumder et al. |
| 7,943,468 B2 | 5/2011 | Curello et al. |
| 7,945,800 B2 | 5/2011 | Gomm et al. |
| 7,948,008 B2 | 5/2011 | Liu et al. |
| 7,952,147 B2 | 5/2011 | Ueno et al. |
| 7,960,232 B2 | 6/2011 | King et al. |
| 7,960,238 B2 | 6/2011 | Kohli et al. |
| 7,968,400 B2 | 6/2011 | Cai |
| 7,968,411 B2 | 6/2011 | Williford |
| 7,968,440 B2 | 6/2011 | Seebauer |
| 7,968,459 B2 | 6/2011 | Bedell et al. |
| 7,989,900 B2 | 8/2011 | Haensch et al. |
| 7,994,573 B2 | 8/2011 | Pan |
| 8,004,024 B2 | 8/2011 | Furukawa et al. |
| 8,008,158 B2 | 8/2011 | Chang et al. |
| 8,012,827 B2 | 9/2011 | Yu et al. |
| 8,029,620 B2 | 10/2011 | Kim et al. |
| 8,039,332 B2 | 10/2011 | Bernard et al. |
| 8,046,598 B2 | 10/2011 | Lee |
| 8,048,791 B2 | 11/2011 | Hargrove et al. |
| 8,048,810 B2 | 11/2011 | Tsai et al. |
| 8,051,340 B2 | 11/2011 | Cranford, Jr. et al. |
| 8,053,321 B2 | 11/2011 | Helm et al. |
| 8,053,340 B2 | 11/2011 | Colombeau et al. |
| 8,063,466 B2 | 11/2011 | Kurita |
| 8,067,279 B2 | 11/2011 | Sadra et al. |
| 8,067,280 B2 | 11/2011 | Wang et al. |
| 8,067,302 B2 | 11/2011 | Li |
| 8,076,719 B2 | 12/2011 | Zeng et al. |
| 8,097,529 B2 | 1/2012 | Krull et al. |
| 8,103,983 B2 | 1/2012 | Agarwal et al. |
| 8,105,891 B2 | 1/2012 | Yeh et al. |
| 8,106,424 B2 | 1/2012 | Schruefer |
| 8,106,481 B2 | 1/2012 | Rao |
| 8,110,487 B2 | 2/2012 | Griebenow et al. |
| 8,114,761 B2 | 2/2012 | Mandrekar et al. |
| 8,119,482 B2 | 2/2012 | Bhalla et al. |
| 8,120,069 B2 | 2/2012 | Hynecek |
| 8,129,246 B2 | 3/2012 | Babcock et al. |
| 8,129,797 B2 | 3/2012 | Chen et al. |
| 8,134,159 B2 | 3/2012 | Hokazono |
| 8,143,120 B2 | 3/2012 | Kerr et al. |
| 8,143,124 B2 | 3/2012 | Challa et al. |
| 8,143,678 B2 | 3/2012 | Kim et al. |
| 8,148,774 B2 | 4/2012 | Mori et al. |
| 8,163,619 B2 | 4/2012 | Yang et al. |
| 8,169,002 B2 | 5/2012 | Chang et al. |
| 8,170,857 B2 | 5/2012 | Joshi et al. |
| 8,173,499 B2 | 5/2012 | Chung et al. |
| 8,173,502 B2 | 5/2012 | Yan et al. |
| 8,176,461 B1 | 5/2012 | Trimberger |
| 8,178,430 B2 | 5/2012 | Kim et al. |
| 8,179,530 B2 | 5/2012 | Levy et al. |
| 8,183,096 B2 | 5/2012 | Wirbeleit |
| 8,183,107 B2 | 5/2012 | Mathur et al. |
| 8,185,865 B2 | 5/2012 | Gupta et al. |
| 8,187,959 B2 | 5/2012 | Pawlak et al. |
| 8,188,542 B2 | 5/2012 | Yoo et al. |
| 8,196,545 B2 | 6/2012 | Kurosawa |
| 8,201,122 B2 | 6/2012 | Dewey, III et al. |
| 8,214,190 B2 | 7/2012 | Joshi et al. |
| 8,217,423 B2 | 7/2012 | Liu et al. |
| 8,225,255 B2 | 7/2012 | Ouyang et al. |
| 8,227,307 B2 | 7/2012 | Chen et al. |
| 8,236,661 B2 | 8/2012 | Dennard et al. |
| 8,239,803 B2 | 8/2012 | Kobayashi |
| 8,247,300 B2 | 8/2012 | Babcock et al. |
| 8,255,843 B2 | 8/2012 | Chen et al. |
| 8,258,026 B2 | 9/2012 | Bulucea |
| 8,266,567 B2 | 9/2012 | El Yahyaoui et al. |
| 8,273,629 B2 | 9/2012 | Wang et al. |
| 8,286,180 B2 | 10/2012 | Foo |
| 8,288,798 B2 | 10/2012 | Passlack |
| 8,298,895 B1 | 10/2012 | Alptekin |
| 8,299,562 B2 | 10/2012 | Li et al. |
| 8,324,059 B2 | 12/2012 | Guo et al. |
| 8,350,327 B2 | 1/2013 | Chung et al. |
| 8,354,321 B2 | 1/2013 | Colombeau et al. |
| 2001/0014495 A1 | 8/2001 | Yu |
| 2002/0042184 A1 | 4/2002 | Nandakumar et al. |
| 2003/0006415 A1 | 1/2003 | Yokogawa et al. |
| 2003/0047763 A1 | 3/2003 | Hieda et al. |
| 2003/0122203 A1 | 7/2003 | Nishinohara et al. |
| 2003/0173626 A1 | 9/2003 | Burr |
| 2003/0183856 A1 | 10/2003 | Wieczorek et al. |
| 2003/0215992 A1 | 11/2003 | Sohn et al. |
| 2004/0075118 A1 | 4/2004 | Heinemann et al. |
| 2004/0075143 A1 | 4/2004 | Bae et al. |
| 2004/0084731 A1 | 5/2004 | Matsuda et al. |
| 2004/0087090 A1 | 5/2004 | Grudowski et al. |
| 2004/0126947 A1* | 7/2004 | Sohn .................. 438/197 |
| 2004/0175893 A1 | 9/2004 | Vatus et al. |
| 2004/0180488 A1 | 9/2004 | Lee |
| 2004/0185629 A1* | 9/2004 | Mansoori et al. ........... 438/289 |
| 2005/0106824 A1 | 5/2005 | Alberto et al. |
| 2005/0116282 A1 | 6/2005 | Pattanayak et al. |
| 2005/0250289 A1 | 11/2005 | Babcock et al. |
| 2005/0280075 A1 | 12/2005 | Ema et al. |
| 2006/0022270 A1 | 2/2006 | Boyd et al. |
| 2006/0049464 A1 | 3/2006 | Rao |
| 2006/0068555 A1 | 3/2006 | Zhu et al. |
| 2006/0068586 A1 | 3/2006 | Pain |
| 2006/0071278 A1 | 4/2006 | Takao |
| 2006/0154428 A1 | 7/2006 | Dokumaci |
| 2006/0197158 A1 | 9/2006 | Babcock et al. |
| 2006/0203581 A1 | 9/2006 | Joshi et al. |
| 2006/0220114 A1 | 10/2006 | Miyashita et al. |
| 2006/0223248 A1 | 10/2006 | Venugopal et al. |
| 2007/0040222 A1 | 2/2007 | Van Camp et al. |
| 2007/0117326 A1 | 5/2007 | Tan et al. |
| 2007/0158790 A1 | 7/2007 | Rao |
| 2007/0212861 A1 | 9/2007 | Chidambarrao et al. |
| 2007/0238253 A1 | 10/2007 | Tucker |
| 2008/0067589 A1 | 3/2008 | Ito et al. |
| 2008/0108208 A1 | 5/2008 | Arevalo et al. |
| 2008/0169493 A1 | 7/2008 | Lee et al. |
| 2008/0169516 A1 | 7/2008 | Chung |
| 2008/0197439 A1 | 8/2008 | Goerlach et al. |
| 2008/0227250 A1 | 9/2008 | Ranade et al. |
| 2008/0237661 A1 | 10/2008 | Ranade et al. |
| 2008/0258198 A1 | 10/2008 | Bojarczuk et al. |
| 2008/0272409 A1 | 11/2008 | Sonkusale et al. |
| 2009/0057746 A1 | 3/2009 | Sugll et al. |
| 2009/0108350 A1 | 4/2009 | Cai et al. |
| 2009/0134468 A1 | 5/2009 | Tsuchiya et al. |
| 2009/0224319 A1 | 9/2009 | Kohli |
| 2009/0302388 A1 | 12/2009 | Cai et al. |
| 2009/0309140 A1 | 12/2009 | Khamankar et al. |
| 2009/0311837 A1 | 12/2009 | Kapoor |

(56) References Cited

U.S. PATENT DOCUMENTS

| | | |
|---|---|---|
| 2009/0321849 A1 | 12/2009 | Miyamura et al. |
| 2010/0012988 A1 | 1/2010 | Yang et al. |
| 2010/0038724 A1 | 2/2010 | Anderson et al. |
| 2010/0100856 A1 | 4/2010 | Mittal |
| 2010/0148153 A1 | 6/2010 | Hudait et al. |
| 2010/0149854 A1 | 6/2010 | Vora |
| 2010/0187641 A1 | 7/2010 | Zhu et al. |
| 2010/0207182 A1 | 8/2010 | Paschal |
| 2010/0270600 A1 | 10/2010 | Inukai et al. |
| 2011/0059588 A1 | 3/2011 | Kang |
| 2011/0073961 A1 | 3/2011 | Dennard et al. |
| 2011/0074498 A1 | 3/2011 | Thompson et al. |
| 2011/0079860 A1 | 4/2011 | Verhulst |
| 2011/0079861 A1 | 4/2011 | Shifren et al. |
| 2011/0095811 A1 | 4/2011 | Chi et al. |
| 2011/0147828 A1 | 6/2011 | Murthy et al. |
| 2011/0169082 A1 | 7/2011 | Zhu et al. |
| 2011/0175170 A1 | 7/2011 | Wang et al. |
| 2011/0180880 A1 | 7/2011 | Chudzik et al. |
| 2011/0193164 A1 | 8/2011 | Zhu |
| 2011/0212590 A1 | 9/2011 | Wu et al. |
| 2011/0230039 A1 | 9/2011 | Mowry et al. |
| 2011/0242921 A1 | 10/2011 | Tran et al. |
| 2011/0248352 A1 | 10/2011 | Shifren |
| 2011/0294278 A1 | 12/2011 | Eguchi et al. |
| 2011/0309447 A1 | 12/2011 | Arghavani et al. |
| 2012/0021594 A1 | 1/2012 | Gurtej et al. |
| 2012/0034745 A1 | 2/2012 | Colombeau et al. |
| 2012/0056275 A1 | 3/2012 | Cai et al. |
| 2012/0065920 A1 | 3/2012 | Nagumo et al. |
| 2012/0108050 A1 | 5/2012 | Chen et al. |
| 2012/0132998 A1 | 5/2012 | Kwon et al. |
| 2012/0138953 A1 | 6/2012 | Cai et al. |
| 2012/0146155 A1 | 6/2012 | Hoentschel et al. |
| 2012/0167025 A1 | 6/2012 | Gillespie et al. |
| 2012/0187491 A1 | 7/2012 | Zhu et al. |
| 2012/0190177 A1 | 7/2012 | Kim et al. |
| 2012/0223363 A1 | 9/2012 | Kronholz et al. |

FOREIGN PATENT DOCUMENTS

| | | |
|---|---|---|
| EP | 0531621 | 3/1993 |
| EP | 0683515 | 11/1995 |
| EP | 0889502 | 1/1999 |
| EP | 1450394 | 8/2004 |
| JP | 59193066 | 11/1984 |
| JP | 4186774 | 7/1992 |
| JP | 8153873 | 6/1996 |
| JP | 8288508 | 11/1996 |
| JP | 2004087671 | 3/2004 |
| KR | 794094 | 1/2008 |
| WO | WO2011/062788 | 5/2011 |

OTHER PUBLICATIONS

Chau, R et al., "A 50nm Depleted-Substrate CMOS Transistor (DST)", Electron Device Meeting 2001, IEDM Technical Digest, IEEE International, pp. 29.1.1-29.1.4 (2001).

Ducroquet, F et al. "Fully Depleted Silicone-On-Insulator nMOSFETs with Tensile Strained High Carbon Content Sil-yCy Channel", ECS 210th Meeting, Abstract 1033 (2006).

Ernst, T et al., "Nanoscaled MOSFET Transistors on Strained Si, SiGe, Ge Layers: Some Integration and Electrical Properties Features", ECS Trans. 2006, vol. 3, Issue 7, pp. 947-961 (2006).

Goesele, U et al., Diffusion Engineering by Carbon in Silicon, Mat. Res. Soc. Symp. vol. 610 (2000).

Hokazono, A et al., "Steep Channel & Halo Profiles Utilizing Boron-Diffusion-Barrier Layers (Si:C) for 32 nm Node and Beyond", 2008 Symposium on VLSI Technology Digest of Technical Papers, pp. 112-113 (2008).

Hokazono, A et al., "Steep Channel Profiles in n/pMOS Controlled by Boron-Doped Si:C Layers for Continual Bulk-CMOS Scaling", IEDM09-676 Symposium, pp. 29.1.1-29.1.4 (2009).

Holland, OW and Thomas, DK "A Method to Improve Activation of Implanted Dopants in SiC", Oak Ridge National Laboratory, Oak Ridge, TN (2001).

Kotaki, H., et al., "Novel Bulk Dynamic Threshold Voltage MOSFET (B-DTMOS) with Advanced Isolation (SITOS) and Gate to Shallow-Well Contact (SSS-C) Processes for Ultra Low Power Dual Gate CMOS", IEDM 96, pp. 459-462 (1996).

Lavéant, P. "Incorporation, Diffusion and Agglomeration of Carbon in Silicon", Solid State Phenomena, vols. 82-84, pp. 189-194 (2002).

Noda, K et al., "A 0.1-μm Delta-Doped MOSFET Fabricated with Post-Low-Energy Implanting Selective Epitaxy" IEEE Transactions on Electron Devices, vol. 45, No. 4, pp. 809-814 (Apr. 1998).

Ohguro, T et al., "An 0.18-μm CMOS for Mixed Digital and Analog Aplications with Zero-Volt-Vth Epitaxial-Channel MOSFET's", IEEE Transactions on Electron Devices, vol. 46, No. 7, pp. 1378-1383 (Jul. 1999).

Pinacho, R et al., "Carbon in Silicon: Modeling of Diffusion and Clustering Mechanisms", Journal of Applied Physics, vol. 92, No. 3, pp. 1582-1588 (Aug. 2002).

Robertson, LS et al., "The Effect of Impurities on Diffusion and Activation of Ion Implanted Boron in Silicon", Mat. Res. Soc. Symp. vol. 610 (2000).

Scholz, R et al., "Carbon-Induced Undersaturation of Silicon Self-Interstitials", Appl. Phys. Lett. 72(2), pp. 200-202 (Jan. 1998).

Scholz, RF et al., "The Contribution of Vacancies to Carbon Out-Diffusion in Silicon", Appl. Phys. Lett., vol. 74, No. 3, pp. 392-394 (Jan. 1999).

Stolk, PA et al., "Physical Mechanisms of Transient Enhanced Dopant Diffusion in Ion-Implanted Silicon", J. Appl. Phys. 81(9), pp. 6031-6050 (May 1997).

Thompson, S et al., "MOS Scaling: Transistor Challenges for the 21st Century", Intel Technology Journal Q3' 1998, pp. 1-19 (1998).

Wann, C. et al., "Channel Profile Optimization and Device Design for Low-Power High-Performance Dynamic-Threshold MOSFET", IEDM 96, pp. 113-116 (1996).

Werner, P et al., "Carbon Diffusion in Silicon", Applied Physics Letters, vol. 73, No. 17, pp. 2465-2467 (Oct. 1998).

Yan, Ran-Hong et al., "Scaling the Si MOSFET: From Bulk to SOI to Bulk", IEEE Transactions on Electron Devices, vol. 39, No. 7 (Jul. 1992).

Komaragiri, R. et al., "Depletion-Free Poly Gate Electrode Architecture for Sub 100 Nanometer CMOS Devices with High-K Gate Dielectrics", IEEE IEDM Tech Dig., San Francisco CA, 833-836 (Dec. 13-15, 2004).

Samsudin, K et al., "Integrating Intrinsic Parameter Fluctuation Description into BSIMSOI to Forecast sub-15nm UTB SOI based 6T SRAM Operation", Solid-State Electronics (50), pp. 86-93 (2006).

Wong, H et al., "Nanoscale CMOS", Proceedings of the IEEE, Vo. 87, No. 4, pp. 537-570 (Apr. 1999).

Banerjee, et al. "Compensating Non-Optical Effects using Electrically-Driven Optical Proximity Correction", Proc. of SPIE vol. 7275 72750E (2009).

Cheng, et al. "Extremely Thin SOI (ETSOI) CMOS with Record Low Variability for Low Power System-on-Chip Applications", Electron Devices Meeting (IEDM) (Dec. 2009).

Cheng, et al. "Fully Depleted Extremely Thin SOI Technology Fabricated by a Novel Integration Scheme Feturing Implant-Free, Zero-Silicon-Loss, and Faceted Raised Source/Drain", Symposium on VLSI Technology Digest of Technical Papers, pp. 212-213 (2009).

Drennan, et al. "Implications of Proximity Effects for Analog Design", Custom Integrated Circuits Conference, pp. 169-176 (Sep. 2006).

Hook, et al. "Lateral Ion Implant Straggle and Mask Proximity Effect", IEEE Transactions on Electron Devices, vol. 50, No. 9, pp. 1946-1951 (Sep. 2003).

Hori, et al., "A 0.1 μm CMOS with a Step Channel Profile Formed by Ultra High Vacuum CVD and In-Situ Doped Ions", Proceeding of the International Electron Devices Meeting, New York, IEEE, US, pp. 909-911 (Dec. 5, 1993).

(56) References Cited

OTHER PUBLICATIONS

Matshuashi, et al. "High-Performance Double-Layer Epitaxial-Channel PMOSFET Compatible with a Single Gate CMOSFET", Symposium on VLSI Technology Digest of Technical Papers, pp. 36-37 (1996).

Shao, et al., "Boron Diffusion in Silicon: The Anomalies and Control by Point Defect Engineering", Materials Science and Engineering R: Reports, vol. 42, No. 3-4, pp. 65-114 (Nov. 2003).

Sheu, et al. "Modeling the Well-Edge Proximity Effect in Highly Scaled MOSFETs", IEEE Transactions on Electron Devices, vol. 53, No. 11, pp. 2792-2798 (Nov. 2006).

* cited by examiner

MULTIPLE TRANSISTOR TYPES FORMED IN A COMMON EPITAXIAL LAYER BY DIFFERENTIAL OUT-DIFFUSION FROM A DOPED UNDERLAYER

CROSS-REFERENCE TO RELATED APPLICATIONS

This non-provisional application claims the benefit of U.S. Provisional Application 61/511,923, entitled, "Epitaxial Transistor Structure and Process for Advanced SoC", and filed 26 Jul. 2011, the entirety of which is hereby incorporated by reference.

FIELD OF THE INVENTION

The present invention relates generally to diffusion processes and dopant profiles for field effect transistors, as well as integrated circuits and processes for making same.

BACKGROUND

Modern integrated circuits typically include millions of transistors. Most commonly these transistors are field effect transistors (FETs). These transistors are typically not identical throughout an integrated circuit, but rather are divided into categories that are based on ranges of various physical, material, electrical, and quantum mechanical properties or characteristics. The aforementioned categories are referred to herein as transistor device types. Illustrative transistor device types that are commonly found in integrated circuits include, but are not necessarily limited to: p-channel FETs, n-channel FETs, FETs tailored for digital or analog circuit applications, high-voltage FETs, high/normal/low frequency FETs, FETs optimized to mimic older FET designs (i.e., legacy FETs), FETs optimized to work at distinct voltages or voltage ranges, and low/high power FETs.

The speed at which FETs switch between conducting (i.e., on) to non-conducting (i.e., off) states is typically related to the threshold voltage (Vt) associated with those FETs. For example, a transistor having a low Vt may switch faster than a transistor having a higher Vt. For speed critical applications, one might be tempted to consider using only transistors having a low Vt. However, one drawback of a low Vt transistor is undesirably high off-state leakage current. Therefore, circuit designers typically optimize an integrated circuit design for, among other things, off-state leakage current by specifying a plurality of transistor device types, each device type having a different threshold voltage. Some transistors may be specified with low Vt, other transistors may be specified with regular Vt, while still others may be specified with high Vt, with various refined Vt settings therebetween. In mobile applications as well as certain desktop applications, space constraints and other factors drive the desire to use semiconductor chips having multiple Vt integrated circuits thereon, and there remains an ongoing interest to reduce the size of the integrated circuit blocks. At the same time, power reduction and extending battery life drive the desire to use efficient semiconductor chip designs having reliable switching. A way to achieve the combined product and circuit design goals is to design semiconductor devices, e.g., transistors, having a greater uniformity of electrical characteristics. For example, a tighter distribution of variations in Vt allow for efficient circuit designs. In this way, switching reliability is achieved, which in turn reduces the need to design in compensation circuitry. The reduced need to design in circuit redundancies can reduce the size of the integrated circuit blocks.

However, fabricating multiple Vt devices in silicon using conventional CMOS processes remains an ongoing challenge. For instance, to set Vt for an individual transistor in a conventional CMOS process while also optimizing for other detrimental factors such as short-channel effects, junction capacitance, drain-induced barrier lowering effects and other issues, process engineers typically use oppositely-doped implanted regions that jut outward of the source and drain and extending inward into the channel a defined distance. Such implanted dopant regions are known as "pocket" or "halo" implants. Usually the halo implant is achieved using a multi-step, controlled implantation that involves driving ionized dopant species into the silicon lattice at high energy. To remedy damage to the lattice structure that results, as well as to activate the dopants, an anneal is typically done. While controllability of the anneal step(s) and the resultant doping profile is generally understood, the process of driving implanted material into silicon at various angles comes with inevitable variation and challenges as to process control. Also, whenever dopants are introduced directly into the transistor channel, the dopants can exhibit random fluctuation in dopant placement and concentration which can adversely affect carrier mobility and corresponding Vt. A further challenge is to carry on such Vt setting techniques as critical dimensions continue to shrink. At these smaller gate lengths, even small fluctuations in the resultant shape of the halo implants affects the final Vt that is set for the transistor. It is therefore difficult to reliably set Vt across a plurality of transistors. A further complication occurs when such processes are applied for multiple transistor device types, each having different Vts. There then results not only the variation from transistor-to-transistor for the same type of transistors, but further variation across different transistor device types. Because of such limitations in the semiconductor process, circuit designers develop techniques and redundancies to compensate for the Vt variation which typically results in a larger cell footprint. Such compensatory designs are not straightforward, and serve to add to the cost of producing an integrated circuit, particularly at the more advanced semiconductor processes.

What is needed are integrated circuits having multiple sets of transistor structures, each set with its own range of physical, material, electrical, and quantum mechanical properties or characteristics, and methods of integrating the manufacture thereof to result in a reduction in the variation of threshold voltage.

BRIEF DESCRIPTION OF THE DRAWINGS

Embodiments of the invention are described with reference to the accompanying drawings. In the drawings, like reference numbers indicate identical or functionally similar elements. Additionally, the left most digit(s) of a reference number identifies the drawing in which the reference number first appears.

DETAILED DESCRIPTION

Figure 1:
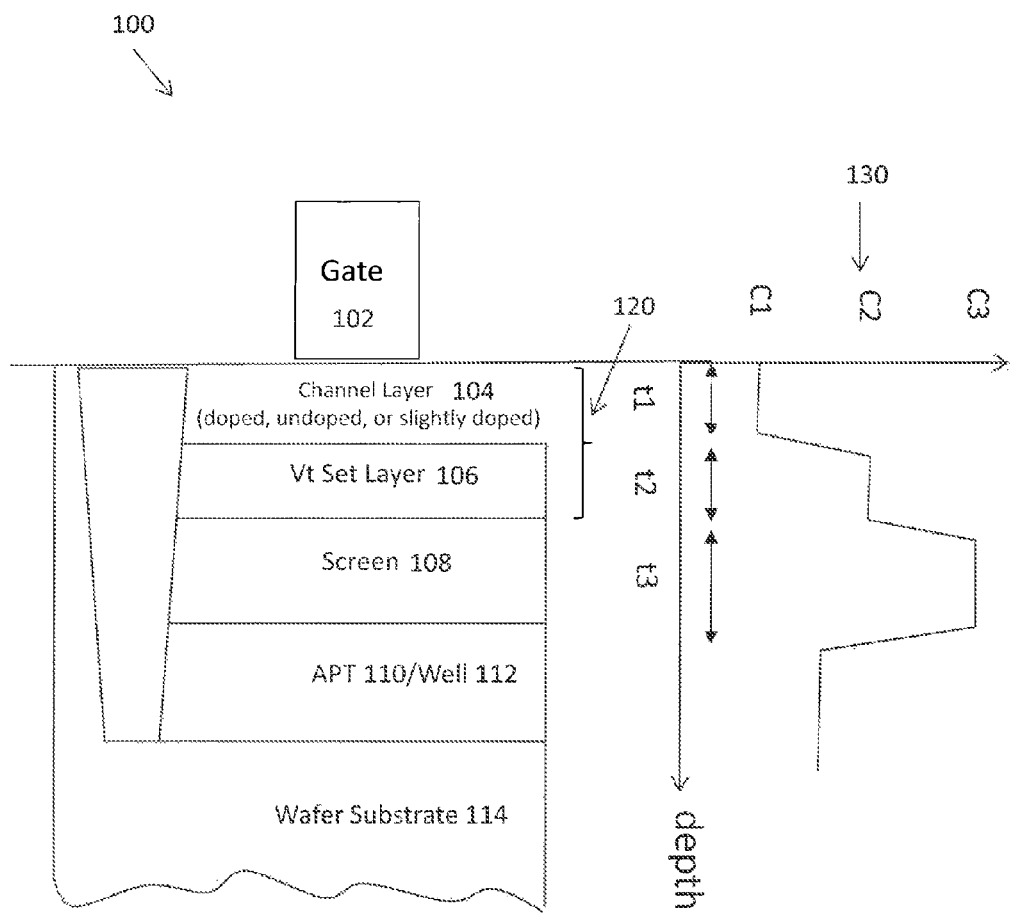
FIG. 1 is a cross-sectional representation of a partially fabricated transistor structure having a screening layer and a blanket epitaxial layer vertically adjacent thereto.

The following Detailed Description refers to accompanying drawings to illustrate exemplary embodiments consistent with the invention. References in the Detailed Description to "one exemplary embodiment," "an illustrative embodiment," "an exemplary embodiment," and so on, indicate that the exemplary embodiment described may include a particular feature, structure, or characteristic, but every exemplary or illustrative embodiment may not necessarily include that particular feature, structure, or characteristic. Moreover, such phrases are not necessarily referring to the same exemplary embodiment. Further, when a particular feature, structure, or characteristic is described in connection with an embodiment, it is within the knowledge of those skilled in the relevant art(s) to affect such feature, structure, or characteristic in connection with other embodiments whether or not explicitly described.

The exemplary embodiments described herein are provided for illustrative purposes, and are not limiting. Other embodiments are possible, and modifications may be made to the exemplary embodiments within the spirit and scope of the invention. Therefore, the Detailed Description is not meant to limit the invention. Rather, the scope of the invention is defined only in accordance with the subjoined claims and their equivalents.

The following Detailed Description of the exemplary embodiments will so fully reveal the general nature of the embodiments that others can, by applying knowledge of those skilled in relevant art(s), readily modify and/or adapt for various applications such exemplary embodiments, without undue experimentation. Therefore, such adaptations and modifications are intended to be within the meaning and plurality of equivalents of the exemplary embodiments. It is to be understood that the phraseology or terminology herein is for the purpose of description and not of limitation, such that the terminology or phraseology of the present specification is to be interpreted by those skilled in relevant art(s) in light of the teachings herein.

Epitaxial layer refers to a layer of single crystal semiconductor material. In this field, an epitaxial layer is commonly referred to "epi."

FET, as used herein, refers to field effect transistor. An n-channel FET is referred to herein as an N-FET. A p-channel FET is referred to herein as a P-FET. Unless noted otherwise the FETs referred to herein are MOSFETs.

As used herein, "gate" refers to the gate terminal of a FET. The gate terminal of a FET is also referred to in this field as a "gate electrode." Historically, the gate electrode was a single structure such as a layer of doped polysilicon disposed on a gate dielectric. More recent developments of the gate have included varying the materials incorporated therein, including the use of metals and metal alloys.

Source/drain (S/D) terminals refer to the terminals of a FET, between which conduction occurs under the influence of an electric field, subsequent to the inversion of the semiconductor surface under the influence of an electric field resulting from a voltage applied to the gate terminal of the FET. Generally, the source and drain terminals of a FET are fabricated such that they are geometrically symmetrical. With geometrically symmetrical source and drain terminals it is common to simply refer to these terminals as source/drain terminals, and this nomenclature is used herein. Designers often designate a particular source/drain terminal to be a "source" or a "drain" on the basis of the voltage to be applied to that terminal when the FET is operated in a circuit.

Substrate, as used herein, refers to the physical object that is the basic workpiece that is transformed by various process operations into the desired microelectronic configuration. Silicon wafers are a commonly used substrate in the manufacture of integrated circuits.

The term vertical, as used herein, means substantially perpendicular to the surface of a substrate.

The expressions "analog device", "analog transistor", "analog FET" and similar phrases or expressions refer to transistors that have electrical characteristics suited for use in analog circuit applications. By way of example and not limitation, FETs used in analog circuit applications are often biased so as to operate in the unsaturated mode, and tend to have higher Vt settings than FETs used in digital or logic circuit applications. When analog and digital circuits exist on the same die, it is not uncommon that the gate length of FETs used in the analog circuitry is greater than the minimum gate length achievable in a given process technology.

The expressions "digital device", digital transistor", digital FET", "logic device", logic transistor", "logic FET" and similar phrases or expressions refer to transistors that have electrical characteristics suited for use in digital circuit applications. By way of example and not limitation, FETs used in digital, or logic, circuit applications are typically driven to be in their fully on state or fully off state. Such FETs tend to have lower Vt settings than FETs used in analog applications. When analog and digital circuits exist on the same die, it is not uncommon that the gate length of FETs used in the digital circuitry is the minimum gate length achievable in a given process technology.

Multiple transistor types are formed in a substantially undoped layer by differential out-diffusion from a doped underlayer. The substantially undoped layer is preferably epitaxially formed silicon or silicon-germanium, which may be formed as a blanket common layer across the different devices, or may be formed selectively. Differential out-diffusion from transistor-to-transistor affects the thickness of the substantially undoped layer and therefore effects a resulting threshold voltage for the transistor.

As noted above, many integrated circuit designs benefit from the availability of a variety, or range, of transistor device types that can be included in those integrated circuits. The availability of multiple transistor device types provides engineers with the resources to produce optimized circuit designs, as well as to produce circuit designs that might otherwise be unachievable if limited to a small number of transistor device types. As a practical matter, it is desirable that each integrated circuit on a wafer be able to incorporate all, or any subset of, the range of transistor device types available in an integrated circuit manufacturing process while achieving a limited variation in threshold voltage both locally and globally.

Disclosed herein are exemplary semiconductor structures, along with methods for making such structures, wherein a plurality of transistor device types are provided within an integrated circuit, and/or within a wafer containing a plurality of integrated circuits.

In an illustrative embodiment, there is provided a wafer in which a plurality of wells have been formed, typically by ion implantation. On at least some of the wells, there is also a heavily doped screen layer having a predetermined thickness and dopant concentration, typically formed by ion implantation. Such a screen layer is located in the uppermost portion of the well, i.e., that portion of the well closest to the surface of the wafer. The screen layer is preferably highly uniform in so as to define a reliable depletion width in the channel when a voltage is applied to the gate. As desired, to target a particular substantially undoped layer thickness, dopant migration inhibitors are used. For instance, carbon may be emplaced together with boron-doped screens. Another example is to use a material that tends to stay in place with proper thermal conditions, such as antimony. Dopants for the screen layer are selected for the desired diffusivity properties and are of opposite conductivity type from the dopants that form the source/drain. N-type dopants are selected for P-FET screen layer, and P-type dopants are selected for N-FET screen layer. It is also noted that combinations of dopant materials can be used. For at least FETs used in digital circuits, electrically active dopants forming the screen can be of the same dopant species, even if multiple dopant-introducing steps are used, though different dopant species of the same conductivity type may be used in combination, as desired to achieve the selected electrical properties to set Vt with controllable out-diffusion. A blanket epitaxial layer of a pre-selected thickness is then formed on the wafer over the screen layer, thereby extending across multiple die and transistor die blocks. The blanket epitaxial layer is preferably formed using a highly uniform process, with within-wafer and wafer-to-water uniformity of less than 5% thickness variation. It is further noted that, to achieve alternative devices, the epitaxial layer may be implanted or grown using in-situ doping to result in various starting-point channel dopant profiles.

In general, using a series of masking steps, selected screen layers are formed for different devices. It is noted that screen layers, though described herein as typically being doped by ion implantation, may also be formed using processes including, but not limited to, in-situ doped epitaxial growth, and diffusion.

Some devices may be specified to be formed conventionally so as to result in a "legacy" device. As used herein, legacy device refers to a transistor having a channel with the Vt set using dopants introduced directly into the channel (such as by halo doping, shallow channel implant or like process). Legacy devices may skip having a screen layer altogether, as a screen layer is not necessary. During the remainder of wafer processing, which includes subsequent feature formations such as the gate, source and drain, contacts and so on, a thermal processing cycle which can include rapid thermal processing, solid phase epitaxy or other thermal process and combinations thereof, is performed using a pre-selected recipe that results in dopant profiles by way of individual degrees of out-diffusion of the screen layer tailored to each device threshold voltage setting target. Transistors are isolated using a shallow trench isolation (STI) process. Preferably the STI process is carried out after the blanket-epitaxial layer is formed, though variants of the embodiments include processes having STI performed before selective epi. It is noted that selective epi refers to the process whereby, instead of a blanket common epitaxial layer formed across the wafer, a selective process is used (which includes a masking step) to result in one or more individual epi regions across a die, and/or across a wafer. Such epi regions, formed by the selective epi process described herein, may have different physical and/or electrical properties. By way of example, and not limitation, the different epi regions may have different thicknesses, different doping concentrations, different doping profiles, different dopant species or combinations of dopant species, and/or be composed of different materials. The different epi regions having the different physical and/or electrical characteristics, enable the formation of a plurality of transistor device types.

After wafer processing and singulation, a plurality of die having at least some with a screen layer and a substantially undoped layer are formed.

Transistors with different Vt, mobility, transconductance, or other electrical characteristics can be created using the embodiments disclosed. Various doping profiles to result in Vt targets in accordance with the present disclosure include undoped channels, deep or shallow screens, and Vt set layers. Additionally, channel materials may be selected as the need arises, for instance, SiGe as opposed to an intrinsic silicon layer.

FIG. 1 illustrates features of a structure 100 capable of being efficiently transformed into various transistor device types through a combination of process operations. As noted above, transistor device types include, but are not limited to: P-FETs, N-FETs, FETs tailored for digital or analog circuit applications, high-voltage FETs, high/normal/low frequency FETs, FETs optimized to mimic older FET designs (i.e., legacy FETs), FETs optimized to work at distinct voltages or voltage ranges, and low/high power FETs, high, low, or regular threshold voltage transistors (i.e., high Vt, low Vt, or regular Vt), and so on. Transistor device types can be distinguished by electrical characteristics (e.g., threshold voltage, mobility, transconductance, linearity, noise, power), or by suitability for a particular application (e.g., signal processing or data storage). Since an integrated circuit such as a system on a chip (SoC), or other complex integrated circuit may require many different transistor device types to achieve the desired circuit performance, structures that can be readily modified to form various transistor device types by way of a manufacturing process having design flexibility is desirable.

Exemplary structure 100 illustrates a partially fabricated FET in accordance with the present disclosure. It will be understood that structure 100 represents a plurality of device types, and further variants not pictured can be used. It is further understood that, though not shown, the embodiments described herein are intended for use to fabricate a plurality of device types, which may be variants around structure 100, or may include combinations of devices generally represented by structure 100 with legacy devices (not shown). It will be appreciated that structure 100, at the stage of fabrication shown in FIG. 1, does not yet include S/D terminals, and so is not yet a transistor.

Structure 100 includes a gate electrode 102. Gate electrode 102 is typically formed of an electrically conductive material such as doped polysilicon, or a metal or metal stack, if metal or metal stack, gate electrode 102 may be formed using either a "gate first" process or a "gate last" process. An epitaxial layer 120 (indicated by bracket) that can support multiple degrees of doping including remaining intrinsic, is grown on a screen layer 108. A separate Vt set layer 106 is depicted, which Vt set layer may be formed by a distinct doping step from the doping for screen layer 108, or may be a result of a controlled out-diffusion from screen layer 108. Screen layer 108, which has a dopant concentration greater than that of any doped layers in epitaxially grown layer 120 is defined above an optional anti-punchthrough (APT) layer 110 or well/deep well layer 112. It is noted that some devices may be designed to be legacy devices, therefore if desired to achieve targeted electrical characteristics of legacy transistors, screen layer 108 and Vt set layer 106 may be omitted. All layers are supported on a bulk silicon wafer substrate 114. In this illustrative embodiment, relative dopant concentration between layers is indicated by adjacent graph 130, which shows the successively decreasing dopant concentration above and below screen layer 108. It is noted that not every transistor structure in an integrated circuit in accordance with the present disclosure is required to have the same relative doping profile as that shown in the FIG. 1. In this illustrative embodiment, epitaxial layer 120 is grown as an undoped layer of silicon. In alternative embodiments, epitaxial layer 120 may include a stoichiometric ratio of another semiconductive material such as germanium. In another alternative embodiment, epitaxial layer 120 may be grown in a manner that incorporates electrically active dopants therein during the epitaxial growth process in predetermined areas in which transistors having certain electrical characteristics are to be formed.

The threshold voltage of a FET formed from structure 100 can be determined, at least in part, by the thickness of epitaxial layer 120, and further determined by dopant concentration and thickness of screen layer 108 as well as Vt set layer 106. The thickness of epitaxial layer 120 is controlled by the extent of controlled diffusion of one or more dopant layers upward into epitaxial layer 120, so that there results a channel layer 104. Other process and/or structural considerations with respect to determining the magnitude of the threshold voltage include, but are not limited to, the presence or absence of lightly doped drains extending into the channel (i.e., subjacent a portion of gate electrode 102), and the material(s) used to form a metal gate electrode.

Implanted dopants can include P-type or N-type dopants in varying concentrations and with varying silicon diffusivity. Materials typically used are boron, indium, thallium, arsenic, phosphorous and antimony for electrically active species, and carbon and germanium and combinations thereof, for diffusion inhibitors. The materials are selected based upon desired electrical and diffusivity characteristics within the constraints of the thermal budget for the fabrication process. Ion implantation operations may use atoms and/or techniques selected to modify the silicon structure from crystalline to amorphous to inhibit diffusion, followed by a controlled anneal to repair damage and activate the dopant species. In some embodiments, carbon is used to suppress the out-diffusion of dopants from screen layer 108 and/or Vt set layer 106.

In some embodiments, epitaxial layer 120 is formed with a nominally constant thickness and extends across an area in which multiple transistor device types are subsequently formed. In other embodiments, epitaxial layer 120 is formed with a nominally constant thickness and extends across an area in which multiple blocks of differing transistor device types are subsequently formed. In still other embodiments, epitaxial layer 120 is formed with a nominally constant thickness and extends across an entire die. In still other embodiments, epitaxial layer 120 is formed with a nominally constant thickness and extends across the entire wafer.

A desirable level of consistency with respect to epitaxial layer thickness, i.e., process uniformity, is preferably obtained. In embodiments where epitaxial layer thickness as grown does not meet the desired uniformity, then planarization techniques involving polishing or etching may be applied to achieve the desired uniform epitaxial layer thickness. Selective epitaxial growth may also be used to result in individualized epitaxial layer thickness from transistor region to transistor region, from cell to cell, from block to block, or die to die.

With a substantially constant epitaxial layer thickness, the distance between gate electrode 102 and screen layer 108 can be varied by controlled out-diffusion. Legacy transistors can be fabricated by implanting channel layer 104, either non-specifically in terms of dopant profile, or by way of halo dopant implants. Such legacy transistors can be formed in conjunction with transistors having a substantially undoped channel 104.

A DDC transistor can be formed from the foregoing described process operations and structures of FIG. 1. A DDC transistor includes a gate electrode, a gate dielectric layer, a first source/drain terminal, and a second source/drain terminal. A structural portion of the DDC transistor, referred to herein as the channel, is bounded on three sides respectively by the first source/drain terminal, the second source/drain terminal, and the gate dielectric layer. In operation, the channel of the DDC transistor is deeply depleted, forming what can be described as a deeply depleted channel, with the depletion region depth bounded by a highly doped screen layer.

As noted, for a DDC transistor, while channel 104 remains substantially undoped, epitaxial layer 120 may include simple or complex layering with different dopant concentrations. This doped layering can optionally include a threshold voltage set layer 106 that has a dopant concentration less than that of screening layer 108. In various embodiments threshold voltage setting layer 106 is disposed vertically adjacent to screen layer 108. Threshold voltage set layer 106 is used to make small adjustments in the operational threshold voltage of the DDC transistor and can be formed by out-diffusion from screen layer 108, in-situ or delta doping during epitaxial growth, of with tightly controlled implants. The portion of the channel adjacent to the gate should remain substantially or completely undoped. Embodiments of various DDC transistor structures and manufacturing processes are more completely described in U.S. patent application Ser. No. 12/708,497 titled Electronic Devices and Systems, and Methods for Making and Using the Same, U.S. patent application Ser. No. 12/971,884 titled Low Power Semiconductor Transistor Structure and Method of Fabrication Thereof, U.S. patent application Ser. No. 12/971,955 titled Transistor with Threshold Voltage Set Notch and Method of Fabrication Thereof, and U.S. patent application Ser. No. 12/895,785 titled "Advanced Transistors With Threshold Voltage Set Dopant Structures", the disclosures of which are hereby incorporated by reference in their entirety.

In some embodiments, screening layer 108 is doped to have a concentration between about $5 \times 10^{18}$ dopant atoms per $cm^3$ and about $1 \times 10^{20}$ dopant atoms per $cm^3$, significantly more than the dopant concentration of the undoped channel, and at least slightly greater than the dopant concentration of the optional voltage threshold set layer 106. It is noted that exact dopant concentrations and screening layer thicknesses can be modified, from those set forth in the illustrative embodiments disclosed herein, to improve desired operating characteristics, or to take into account available transistor manufacturing processes and process conditions. To help control leakage, an anti-punchthrough layer 110 can optionally be formed beneath screening layer 108. Typically, anti-punchthrough layer 110 is formed by direct implant into a lightly doped well 112, but it can alternatively be formed by out-diffusion from screening layer 108, in-situ growth, or other known process. Anti-punchthrough layer 110 has a dopant concentration less than that of screening layer 108, typically set between about $1\times10^{18}$ dopant atoms per cm³ and about $1\times10^{19}$ dopant atoms per cm³. In addition, the doping concentration of anti-punchthrough layer 110 is set higher than the overall doping concentration of well 112. It is noted that exact dopant concentrations and depths can be modified, from those set forth in the illustrative embodiments disclosed herein, to improve desired operating characteristics of the transistor, or to take into account available transistor manufacturing processes and process conditions.

As disclosed, threshold voltage set layer 106 is positioned vertically adjacent screening layer 108, and is typically formed as a thin doped layer. In some embodiments, delta doping, controlled in-situ deposition, or atomic layer deposition can be used to form a dopant plane that is substantially parallel and vertically offset with respect to screening layer 108. Alternatively, threshold voltage set layer 106 can be accomplished by way of a controlled diffusion of screen layer dopant material upward a distance into channel layer 104 to a preselected depth below gate electrode 102. Suitably varying dopant concentration, thickness, and separation from the gate dielectric and screening layer 108 allows for controlled slight adjustments of threshold voltage in the operating transistor. In some embodiments, threshold voltage set layer 106 is doped to have a concentration between about $1\times10^{18}$ dopant atoms per cm³ and about $1\times10^{19}$ dopant atoms per cm³. Threshold voltage set layer 106 can be formed by several different processes, including 1) in-situ epitaxial doping, 2) epitaxial growth of a thin layer of silicon followed by a tightly controlled dopant implant (e.g., delta doping), 3) epitaxial growth of a thin layer of silicon followed by dopant diffusion of atoms from screen layer 108, 4) ion implantation into screen layer 108, preferably using a different dopant material from the dopant forming the screen layer 5) controlled out-diffusion from screen layer 108 or by any combination of these processes.

As used herein, "channel" refers to a region that extends between the source and the drain, and supports movement of mobile charge carriers between the source and the drain. Channel thickness typically ranges from 5 to 50 nanometers, with thickness in a particular instance being dependent on the desired transistor electrical characteristics and technology node (i.e., a 20 nm gate length transistor will typically have a thinner channel than a 45 nm gate length transistor). In some embodiments, dopant migration resistant layers of carbon, germanium, or the like can be applied along with or above screen layer 108 to further limit dopant migration.

In still another embodiment, a slightly depleted channel (SDC) transistor can also be formed using screen layer 108 and epitaxial layer 120 of the partially fabricated semiconductor structure 100 FIG. 1. The SDC transistor may use screen layer 108 doped to have the same or similar dopant concentration as that of the DDC transistor, so that screen layer 108 remains effective to define the depletion width for the transistor when a voltage is applied to gate 102. However, an SDC transistor is distinct from a DDC transistor in that implants, in-situ epitaxial growth, screen layer out-diffusion, or other dopant positioning methods are used to spread dopants into the epitaxial layer, including the channel. The concentration and uniformity of dopants can vary, but will be intermediate between DDC transistors that normally are substantially undoped, and highly doped conventional or legacy transistors. Because of the channel dopants, such transistors can be better matched to legacy transistor device types than undoped channel DDC transistors. Advantageously, such SDC circuits can reduce redesign requirements, can match channel functionality of legacy circuits more closely, and may not need auxiliary bias. In addition, short channel effects are reduced, allowing an increase in lightly doped drain dose that provides higher drive current than comparable DDC transistors. It is noted that Vt variations and mobility in the channel for an SDC transistor are improved relative to a conventional FET, but an SDC transistor will not generally have as high mobility or as reliable a Vt set as a DDC transistor.

A legacy transistor, in accordance with the present disclosure, is a field effect transistor having conventional electrical performance characteristics that is constructed by applying dopants into the channel so as to set the threshold voltage and determine transistor characteristics such as short channel effects. More specifically, threshold voltage implants, channel dopant implants, and halo implants can all be used to modify channel characteristics to achieve legacy transistor-like characteristics. In some embodiments, screen layer implants can be reduced or minimized, subjected to counter-doping, or otherwise altered to allow closer matching to conventional transistor structures. Alternatively, screen layer implants may be omitted altogether. In other embodiments, the screen layer can be heavily doped, and subsequent out-diffusion into the channel produces a doping profile needed to establish the electrical characteristics associated with desired legacy transistors. While such transistors have inferior mobility, increased noise and increased variation of threshold voltage as compared DDC or SDC transistors, integrated circuits including legacy transistors can be useful for avoiding or minimizing the extent of circuit block redesigns.

Figures 2A, 2B:
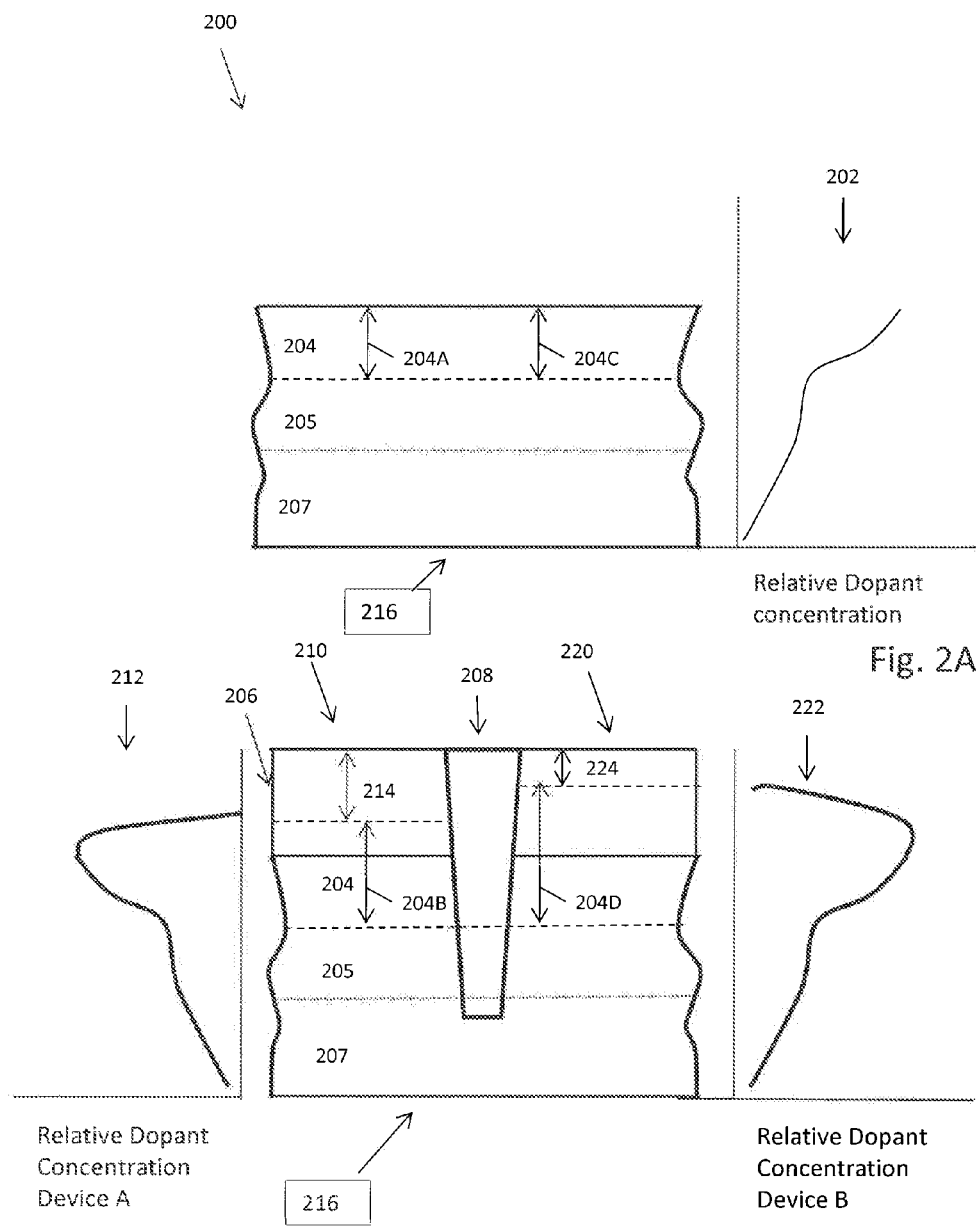
FIG. 2A is a cross-sectional representation of a portion of a wafer with a doping profile prior to forming transistor structures therein.
FIG. 2B is a cross-sectional representation of two partially fabricated DDC transistor device types, formed in part by out-diffusion from a screen layer, including a high Vt transistor and a low Vt transistor.

FIGS. 2A and 2B illustrate selected structures and processing steps in the manufacture of an integrated circuit 200 having the structural foundation to form at least two distinct transistor device types 210 and 220 separated by an isolation structure 208, and having separate Vt settings achieved by varied screen layer thickness and depth.

Referring to FIG. 2A, the structural foundations of the transistor device types 210 and 220 are constructed on a common substrate 216 that is singly or multiply implanted with dopants, providing an initial dopant profile 202.

Dopant profile 202 roughly defines layers that will result post-processing in at least three distinct layers, including a screen layer 204, an anti-punchthrough layer 205, and a well 207, all supported on substrate 216. The dopant concentration typically peaks at the bottom, middle or top portion of screen layer 204. As will be appreciated, one or more dopants having different diffusivity characteristics can be co-implanted. For those devices where dopants from screen layer 204 should not be allowed to migrate upward, a capping layer made of carbon or other diffusion inhibiting material can be incorporated in the top portion of screen layer 204.

Referring to FIG. 2B, a common epitaxial layer 206 is grown on substrate 216. Epitaxial layer 206 is typically intrinsic silicon, but all or portions thereof may be silicon germanium, or another material suitable for forming the channel of a FET. Portions of epitaxial layer 206 that respectively form devices types 210 and 220 can be differentially treated with constant or graded profile carbon or other diffusion inhibiting or for that matter, promoting implants. The devices are then subjected to one or more thermal cycles (including optional rapid thermal processing) specially designed to achieve pre-selected migration levels of the dopants for the various devices to result in channel doping characteristics specific to the devices. Because of the differential carbon concentrations for selected devices, upward diffusion of dopants from screen layer 204 and ultimate thickness of the screen layer and resulting channel layer 214/224 are different for the different devices.

Alternatively the wafer can be masked to protect that portion of the substrate that will form device 210, and additional dopant species can be implanted in the portion of the substrate that forms device 220. If the newly implanted dopant species has an increased diffusivity as compared to the blanket implanted dopant species, the faster moving dopant will migrate further than dopants in the earlier masked region. Effective diffusivity differentials result in different dopant profiles and are illustrated as profiles 212 and 222, with screen layer 204 slightly increasing in thickness (as indicated respectively by the length differential between arrows 204A and 204B) for device 210 and greatly increasing in thickness for device 220 (as indicated respectively by the length differential between arrows 204C and 204D). It is noted that after formation of gate and S/D terminals to complete the transistor structures (not shown), and under the same operating conditions there will be device groupings having distinct threshold voltages, e.g., high Vt, regular Vt and low Vt. This is because of the differing distances of the screen layer from the gate, even while otherwise sharing the same epitaxially grown channel, thermal processing/anneal conditions and having similar gate lengths. Those devices that are formed to result in DDC or SDC transistors will have noticeably better threshold voltage variation compared to the legacy transistor devices. Thus, a common process platform supports the incorporation of a wide variety of transistor device types, and is well-suited for use in the manufacture of integrated circuits such as, but not limited to, SoCs.

Figures 3A, 3B:
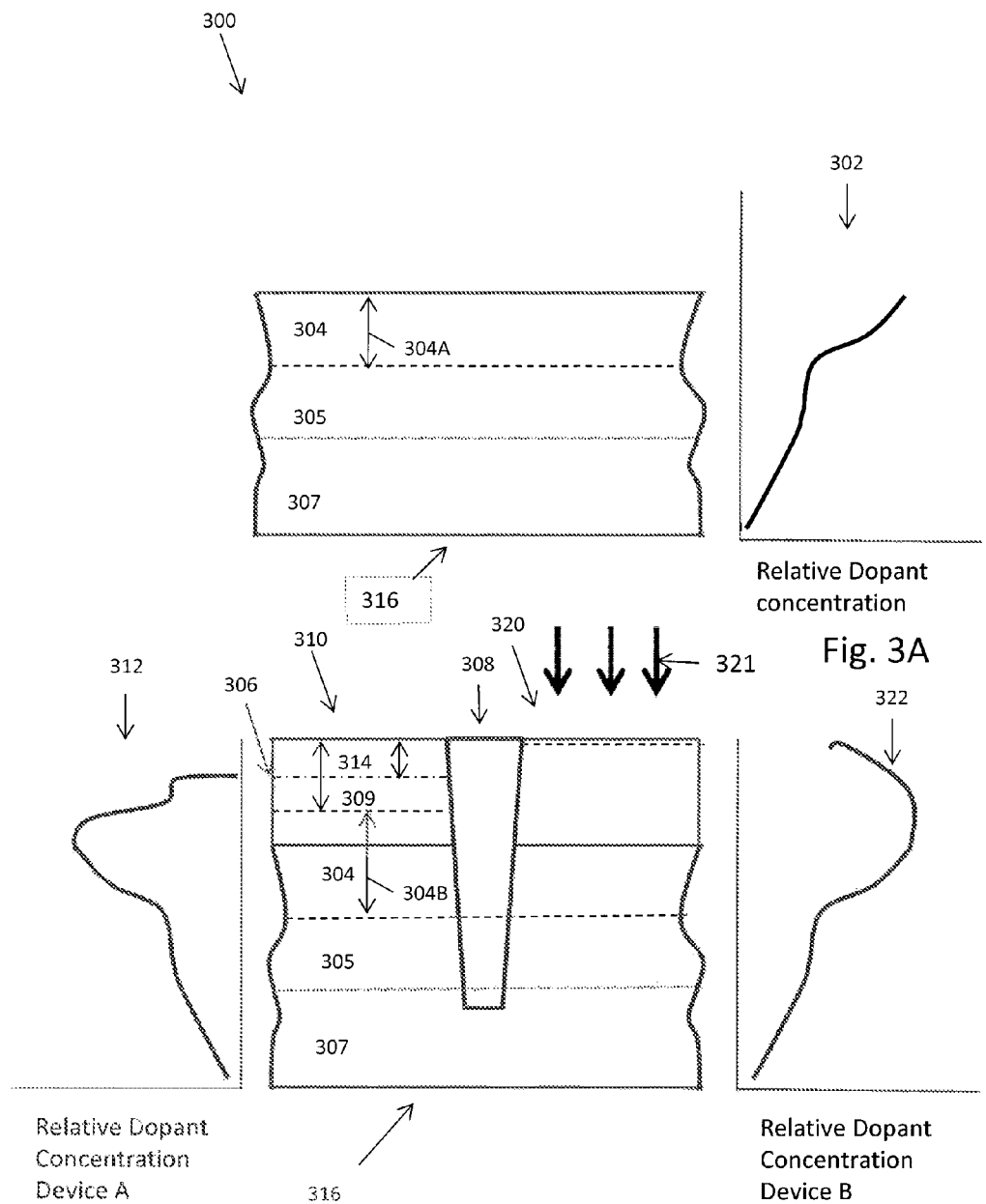
FIGS. 3A and 3B illustrate two partially fabricated device types formed in part by out-diffusion from a screen layer, including a DDC transistor with threshold voltage set layer and a slightly depleted channel (SDC) transistor.

FIGS. 3A and 3B illustrate selected structures and processing steps in the manufacture of an SoC 300 with at least two distinct device types 310 and 320 separated by isolation structure 308, and having separate Vt settings due to a modified screen layer depth, again achieved by way of preselected diffusion level upward toward the gate into a commonly grown epitaxial layer 306. As seen in FIG. 3A, the devices are constructed on a common substrate 316 that is singly or multiply implanted with dopants, providing an initial dopant profile 302. The dopant profile roughly defines regions that will result post-processing in at least three distinct layers, including a screen layer 304, an anti-punchthrough layer 305, and a well 307. The dopant concentration peaks at or near the surface of substrate 316 in screen layer 304 (with screen thickness 304A). It is noted that dopants having differing diffusivity characteristics can be co-implanted. As seen in FIG. 3B, a common blanket layer 306 is epitaxially grown on screen layer 304. Epitaxial layer 306 is typically intrinsic silicon, but all or a portion thereof can be silicon germanium, or other channel material. Portions of epitaxial layer 306 that respectively form device types 310 and 320 can be differentially treated with constant or graded profile carbon or other diffusion inhibiting or promoting implants. For device 310, because of the differential carbon concentration, upward diffusion of dopants from screen layer 304, and the ultimate thickness of the screen layer and channel layer 314 for a device can include multiple layers and dopant concentrations, with an intermediate threshold set layer 309 having an intermediate dopant concentration between channel layer 314 and screen layer 304 (with screen layer 304 shown here as somewhat expanded into epitaxial layer 306 by out-diffusion during thermal cycling to have thickness 304B). The wafer can be masked to protect that portion of the substrate that will form device 320, and additional dopant species can be implanted in the portion of the substrate that forms device 310. If the newly implanted dopant species in a given area has an increased diffusivity as compared to the previously implanted dopant species, the faster moving dopant will migrate further than dopants in the earlier masked region and form threshold set layer 309. For instance, if an Sb implant is made in one area, followed by an As implant thereon, the As implant will tend to be a faster moving species and therefore is situated to form the Vt region over the otherwise Sb doped screen layer. Direct or halo implants 321 can in addition be used to dope the channel of device 320, as desired, after temporarily masking device 310. In effect, the differences between effective diffusivity and implant conditions can result in different dopant profiles and are respectively illustrated as profile 302 and 322. Screen layer 304 is only moderately increased in thickness for device 310, with an intermediate threshold voltage set layer 309. Whereas, screen layer 304 greatly increases in thickness for device 320 to essentially eliminate the previously undoped channel, in effect forming a transistor having operation properties similar to a traditional channel doped legacy transistor. After formation of gate and source/drain structures to form the transistor devices (not shown), under the same operating conditions device will also have a significantly different higher threshold voltage (high Vt) as compared to the other device (regular Vt) because of the differing screen and channel dopant conditions, even while otherwise sharing the same thermal processing/anneal conditions and having similar dimensions.

Figure 4:
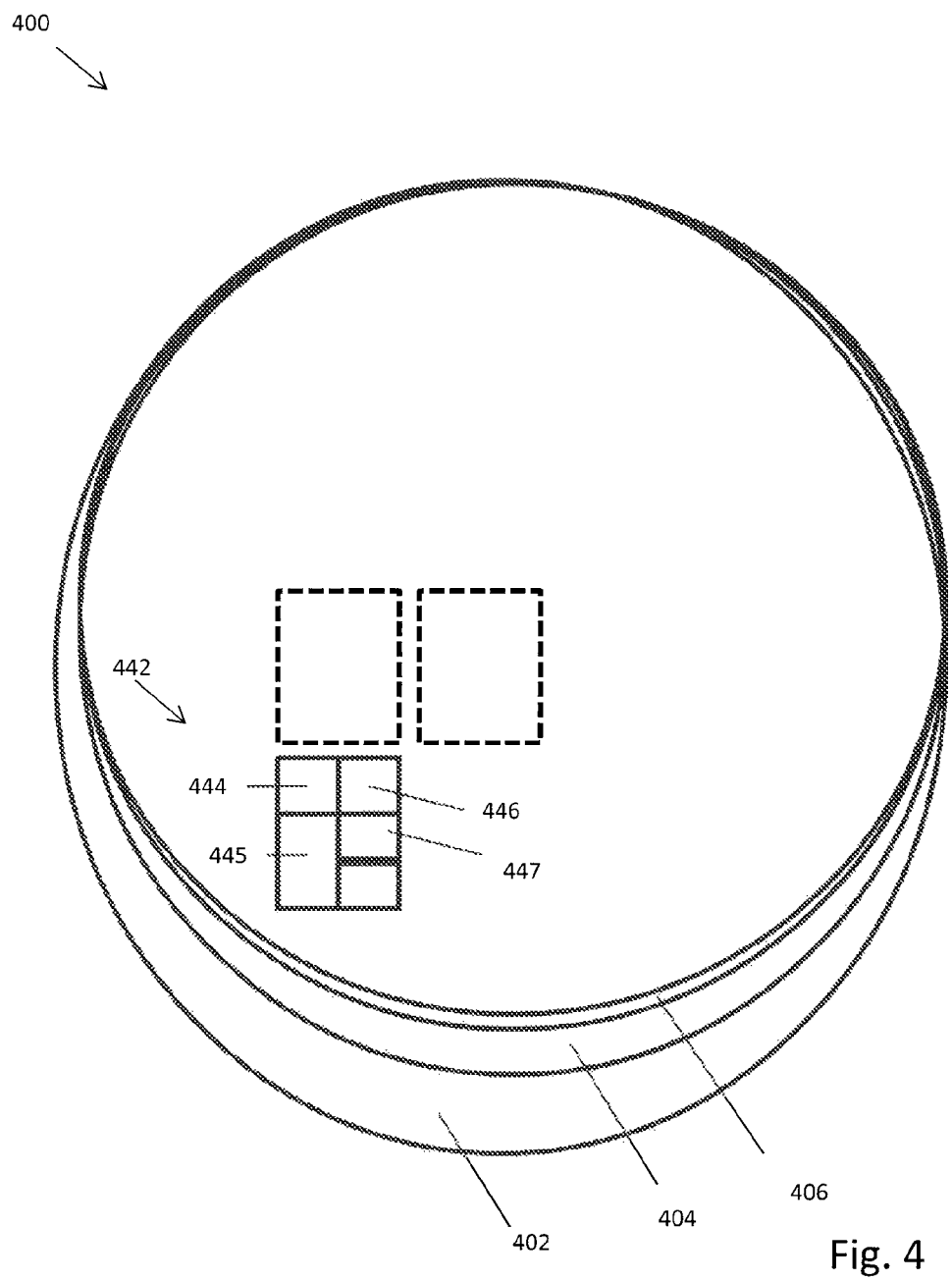
FIG. 4 illustrates four representative and distinct transistor device types that can be supported on the wafer and die.

FIG. 4 illustrates a semiconductor wafer 442 supporting multiple die such as previously described. In accordance with the present disclosure each die can support multiple blocks of circuitry, each block having one or more transistor device types. Such an arrangement enables the creation of complex system on a chip (SoC) integrated circuits or similar die that optionally include FETs tailored for analog, digital, or legacy circuit applications, along with improved transistors such as the DDC and SDC transistors described herein. For example, four useful blocks in a single die are illustrated as follows: block 444 outlines a collection of deeply depleted channel (DDC) transistors; block 445 outlines slightly depleted channel (SDC) transistors; block 446 outlines conventional channel doped legacy transistors; and block 447 outlines transistors tailored for analog circuit applications which may be formed using a DDC scheme, an SDC scheme or may be legacy. As will be appreciated, these transistor types are representative and not intended to limit the transistor device types that can be usefully formed on a die or wafer. Wafer 400 includes a substrate 402 (typically silicon), that can be implanted with optional anti-punchthrough and required screening layer 404, and an epitaxial blanket layer 406 grown after implantation of dopants in layer 404.

Figure 5:
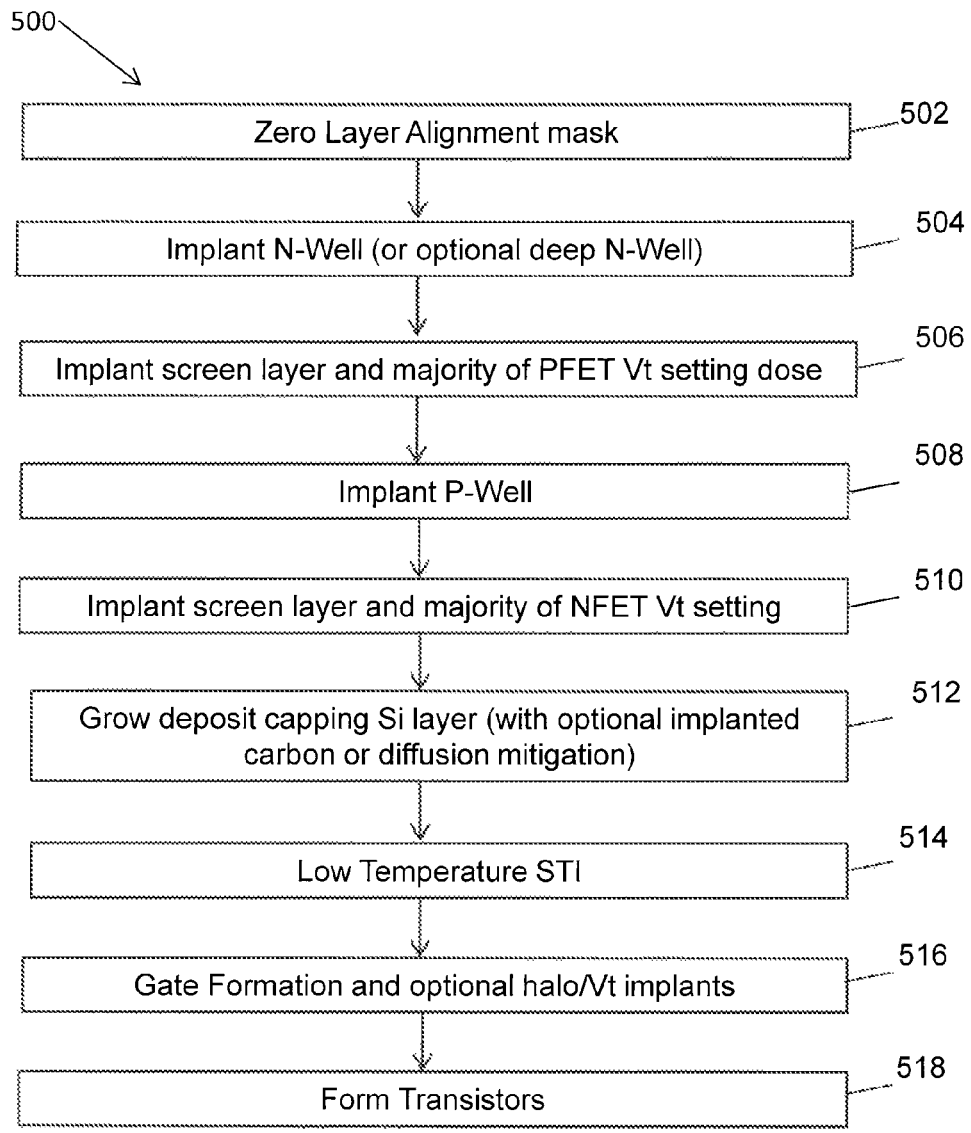
FIG. 5 is an illustration of selected process steps in the formation of a blanket epitaxial channel transistor.

One embodiment of a portion of a transistor manufacturing process 500 is illustrated by FIG. 5. A wafer is masked 502 with a "zero layer" alignment mask to define dopant implantable well regions. A deep N-well can be optionally formed 504 in combination with a conventional N-well. A highly doped screen layer and/or Vt set implant 506 using a different dopant species with increased or decreased silicon diffusivity can also optionally be formed. After masking the N-well, the P-well is implanted 508. Other well implants such as an anti-punchthrough implant can also be formed in the respective P and N-wells, before or after screen layer implantation. When the well doping is complete, an optional carbon or other migration inhibitor is then doped onto the wells. Next, a silicon epitaxial layer is grown 512 across the entire substrate to a preselected thickness and uniformity and provides a sufficient maximum silicon channel thickness for selected devices to be DDC devices. Typically the layer is silicon, but silicon germanium or other non-silicon in-situ deposited atoms can also be added to the epitaxial layer either across the substrate or at preselected device locations using masks. Preferably in a sequence that follows epitaxial growth, shallow trench isolation (STI) structures made by etching trenches and depositing the same with electrically insulative material are formed to separate wells 514. Temperature cycling is then performed to cause the screen layer dopants to migrate selected distances upward into the silicon channel, the distance upward determined by the temperature, time and extent of migration stop dopant materials contained in the devices. Gate structures, spacers, contacts, stress implants, tensile films, dielectric coatings, and the like are then formed, and additional channel doping can optionally be done using halo implants and/or traditional channel implants 516. Additional well-known steps may be performed to complete various transistor structures such as, but not limited to, S/D terminal formation, S/D terminal contact formation, silicidation, gate contact formation, and so on 518. Other advantages and possible process variations are discussed in particular in U.S. patent application Ser. Nos. 12/708,497; 12/971,884 and 12/971,955, all of which were previously incorporated by reference.

As will be appreciated, forming transistor isolation structures after some or all of well dopant implants are made and the blanket epitaxial layer is formed is an effective technique for reducing unwanted dopant scattering and for more precisely controlling screen layer depth across the wafer (and die or die blocks). In contrast to conventional "isolation first" processes, where isolation structures are defined, followed by masking and well implant, an "isolation last" process such as previously described effectively eliminates or reduces well implant scattering from isolation structures. At least some of the well/screen layer implants are made, and then trench etch and insulating layer growth can be done to electrically isolate the respective wells as required. Such isolation last structures and processes are more completely described in U.S. patent application Ser. No. 12/708,497; 12/971,884 and 12/971,955, all of which were previously incorporated by reference.

To better understand design selection parameters, required transistor structures, and suitable processes the following Tables and Examples are provided:

In the following Table 1, a range of suitable materials, operating parameters, and the like are described for commonly required transistor device types that can constructed according the present disclosure. In the Table 1, C1, C2, and C3 respectively refer to ranges of layer concentrations for the channel, voltage threshold set layer, and screen layer as shown in FIG. 1; t1, t2, and t3 respectively refer to thickness of the channel, voltage threshold set layer, and screen layer.

Figure 6:
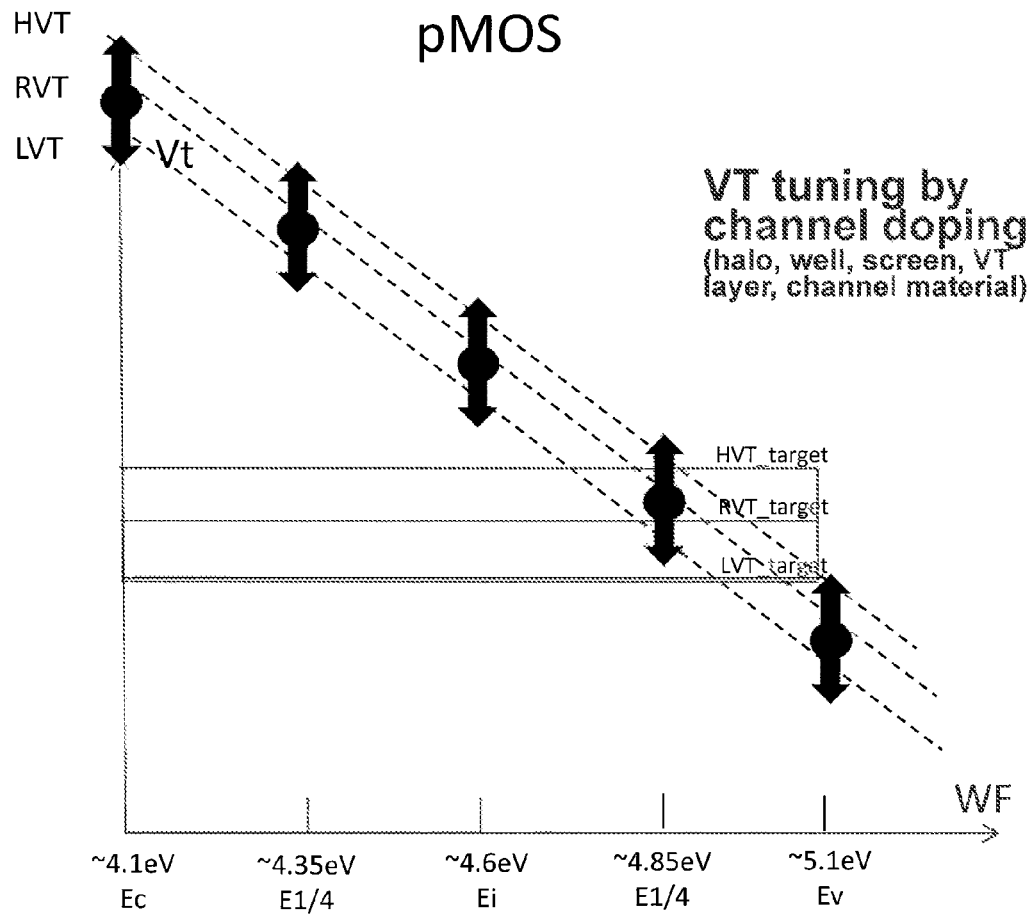
FIG. 6 illustrates possible metal work function selection in conjunction with epitaxial channel dopant modifications.

As seen in FIG. 6, gate work function selection can also be used in conjunction with varying channel/screen/threshold voltage set layer dopant concentration to further adjust the threshold voltage of FETs. TiN has a mid-gap work function of approximately 4.6 eV and can be used as the metal for a gate electrode. The TiN work function can be adjusted as desired by selective nitridization or other process that modifies the relative concentration of the two materials or the thickness of the TiN, thereby allowing for still another set point against which the FETs can be targeted for screening layer concentrations and thickness, as well as channel thickness. In FIG. 6, a PFET can require a certain metal selection, determined by matching the desired Vt to a desired work function. This same metal can be used in at least some other transistor device types by varying channel thickness, material, changing concentration and thickness of screen and/or threshold voltage layers, providing a design selection spread that can encompass, for example, a high Vt and a regular Vt FET. The same mask/metal can be used for two or more transistor device types, thus simplifying, and reducing the time required for, manufacturing an integrated circuit.

EXAMPLE 1

Legacy Logic and Well Matched DDC SRAM in Cells

Figure 7:
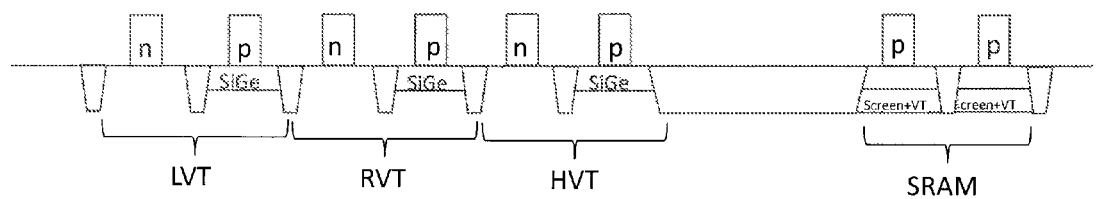
FIG. 7 is a cross-sectional representation of a partially fabricated integrated circuit including both legacy and DDC transistors.

In accordance with the present disclosure, and as seen in FIG. 7, it is possible for a single die to incorporate multiple legacy style doped channel transistor device types, as well as undoped channel DDC transistors or SDC transistors or combinations thereof. SRAM bit cells do not tolerate large variations in random dopant fluctuation, and require relatively tight matching of threshold voltage. In FIG. 7, the epitaxial layer in the SRAM section supports a Vt set layer and undoped channel in a DDC configuration, while for other transistors, the same epitaxial layer is doped to legacy transistor specification levels with halo implants and channel Vt implants. The P-FET metal gate may be reused for DDC transistors because Vt setting is reliably achieved therein. More particularly, the legacy P-FET and the SRAM DDC P-FET each use the same gate metal, but may have different channel materials, i.e., SiGe and Si respectively. This provides a work function difference that in turn produces different threshold voltages for the two transistor device types.

TABLE 1

|  | Low Vt | Regular Vt | High Vt | SRAM |
|---|---|---|---|---|
| VT range | [0.2 V-0.4 V] | [0.3-0.5 V] | [0.4-0.6 V] | [0.4-0.6 V] |
| Target doping profile | t1 [10-15 nm] t2 [0-5 nm] C1 [0-1e17] C2 [1e17-1e18] C3 [1e18-1e19] | t1 [5-10 nm] t2 [5-10 nm] C1 [0-1e17] C2 [1e17-1e18] C3 [1e18-1e19] | t1 [0-5 nm] t2 [10-15 nm] C1 [0-1e17] C2 [1e17-1e18] C3 [1e18-1e19] | t1 [10-15 nm] t2 [0-5 nm] C1 [0-1e17] C2 [1e17-1e18] C3 [1e18-1e19] |
| Gate Stack | N-FET: N P-FET: P | N-FET: N P-FET: P | N-FET: N P-FET: P | P-FET/N-FET metal swap |
| Carbon in screen (nMOS) | Energy [1-5 keV] Dose [3e14-2e15] | Energy [1-5 keV] Dose [0-3e14] | Preferably no C | Energy [1-5 keV] Dose [3e14-2e15] |
| Screen dopant species | N-FET: B, $BF_2$, In P-FET: Sb | N-FET: B, $BF_2$ P-FET: Sb or As | N-FET: B, $BF_2$ P-FET: As | N-FET: B, $BF_2$, In P-FET: Sb |
| Epitaxy | Undoped or C-doped | Undoped | Undoped | Undoped, or C-doped |
| Additional Halo implantation | Preferably 0 | Dose: [5e12-2e13] | Dose: [1e13-4e13] | Preferably 0 |
| Channel material | Si, or SiGe channel for P-FET | S or SiGe channel for P-FET | Si, or SiGe channel for P-FET | Si |

EXAMPLE 2

Integrated Circuit with SDC and Well Matched DDC SRAM Cells

Figure 8:
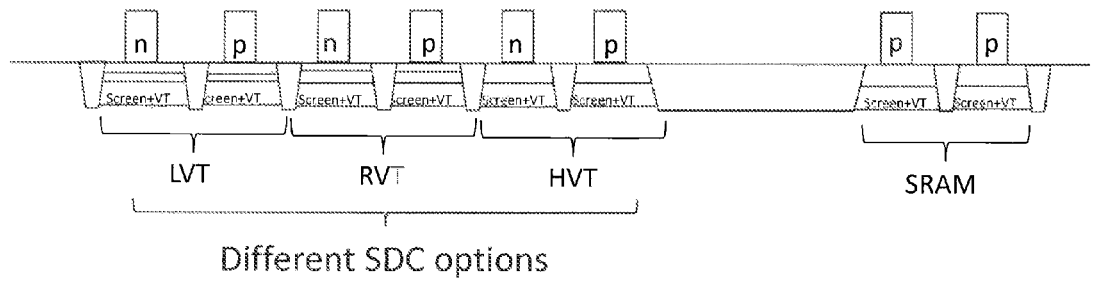
FIG. 8 is a cross-sectional representation of a partially fabricated integrated circuit including SDC and DDC transistors.

In accordance with the present disclosure, and as seen in FIG. 8, a single die can support SDC doped channel FETs, as well as undoped channel DDC FETs. SRAM bit cell circuits do not tolerate FETs with large variations in random dopant fluctuation, and require relatively tight matching of threshold voltage. In FIG. 8, the epitaxial layer in the SRAM section supports a Vt set layer and undoped channel, while the same epitaxial layer is doped to varying levels by out-diffusion from a screen layer, with optional halo implants and channel Vt implants to better approximate legacy transistor characteristics in other circuits. Another embodiment is to fabricate the one device type in the SRAM cell as DDC, either the P-FET or the N-FET, with the other device remaining legacy within the SRAM itself. Thus, a common process platform supports the incorporation of a wide variety of transistor device types, and is well-suited for use in the manufacture of integrated circuits such as, but not limited to, SoCs.

EXAMPLE 3

Integrated Circuit with DDC SRAM Transistors in the Bit Cell

In accordance with the present disclosure, for an integrated circuit such as an SoC SRAM DDC transistors in the bit cell are provided. The screening layer is implanted before shallow trench isolation structures are formed, and before a substantially undoped epitaxial silicon layer is grown on a surface of the screen layer. To create a high threshold voltage DDC FET, a starting-point high dose screening layer is formed. Depending on the thermal cycle, the dopant diffusivity, and optional implanted diffusion mitigation implants such as carbon, the channel under the gate remains substantially undoped. In some embodiments, a separate Vt set layer below an undoped channel may be provided or formed. For the remaining transistors that are not SRAM, legacy transistors are formed preferably using a scheme as describe above.

EXAMPLE 4

Integrated Circuit with DDC Transistors in an SRAM and Logic Circuits, with Legacy Style FETs in Analog Circuits In a process in accordance with the present disclosure, a wafer including a plurality of die is manufactured so that dopants are implanted before shallow trench isolation. In such a process, a heavily doped screen layer is implanted before shallow trench isolation structures are formed, and before a low or undoped epitaxial silicon layer is grown on a surface of the screen layer. An out-diffusion step moves dopants from the screen layer into the epitaxial layer. These out-diffused dopants can provide the majority of a threshold voltage setting dose for FETs that will be formed in that region of the epitaxial layer. In this example, transistors used in the SRAM bit cells and logic circuits are intended to have different electrical characteristics than the transistors used in circuits that were designed to work with transistors having legacy characteristics. Thus these two types of transistors will be formed in a common epitaxial layer and may both have dopants out-diffused from the screen layer, but will have different electrical characteristics once fully fabricated. More particularly, some or all of the legacy FETs formed on the same epitaxial layer are separately doped with halo implants into the epitaxial layer to create transistors compatible with legacy operation.

In some embodiments, the SRAM bit cell includes two cross-coupled CMOS inverters wherein the N-FETs and P-FETs of the two inverters have the same gate length and gate width. The majority of threshold voltage setting dose is out-diffused from the screen layer into epitaxial layer and acts to set the threshold voltage of one of the two device types, for instance, P-FET only with N-FETs being DDC transistors.

Transistor device types in accordance with teachings of the present disclosure can be formed on a die, alone or in combination with other transistor types, and have a reduced mismatch arising from scattered or random dopant variations as compared to conventional FETs. This is particularly important for transistor circuits that rely on closely matched transistors for optimal operation, including differential matching circuits, analog amplifying circuits, and many digital circuits in widespread use such SRAM cells. Variation can be even further reduced by adoption of structures such as a screen layer, an undoped channel, or a Vt set layer as described herein to further effectively increase the headroom which the FETs have to operate. These electrical characteristics allow, among other things, high-bandwidth electronic circuits having improved sensitivity and performance.

In one illustrative embodiment, in accordance with the present disclosure, a method of forming a plurality of transistor device types on an integrated circuit, includes doping selected portions of a wafer to form a first plurality of wells of a first conductivity type; doping selected portions of the first plurality of wells to form a screen layer of the first conductivity type, the screen layer being disposed closer to a surface of the wafer than the wells; growing an epitaxial layer over the surface of the wafer; differentially out-diffusing dopants from the screen layer into the epitaxial layer; and subsequent to formation of the epitaxial layer, forming shallow trench isolation structures. Some embodiments further include doping one or more regions of the screen layer with a diffusion affecting species.

In another illustrative embodiment, in accordance with the present disclosure, a method of making a System on Chip integrated circuit, includes forming a plurality of transistor device types on a die; and interconnecting predetermined ones of the plurality of transistor device types to form a plurality of circuit blocks; wherein forming the plurality of transistor device types includes forming transistor channel regions having different electrical characteristics by differentially out-diffusing dopants into a common epitaxial layer from an underlying screen layer, the screen layer having a plurality of compositionally different regions. Interconnection of transistors on integrated circuits by way of various contacts, vias, and electrically conductive interconnect lines is well known in this field and is not further described herein.

In another illustrative embodiment, in accordance with the present disclosure, an integrated circuit, includes a plurality of n-channel field effect transistors (NFETs) and a plurality of p-channel field effect transistors (PFETs) all disposed in a commonly formed epitaxial layer; a screen layer underlying the epitaxial layer, the screen layer having a plurality of regions with different doping profiles; a first portion of the plurality of NFETs having a first set of electrical characteristics and a second portion of the plurality of NFETs having a second set of electrical characteristics that are different from the first set of electrical characteristics; and a first portion of the plurality of PFETs having a third set of electrical characteristics and a second portion of the plurality of PFETs having a fourth set of electrical characteristics that are different from the third set of electrical characteristics; wherein the difference between the first and second sets of electrical characteristics are related to the different doping profiles of the respective underlying regions of the screen layer, and the difference between the third and fourth sets of electrical characteristics are related to the different doping profiles of the respective underlying regions of the screen layer.

CONCLUSION

It is to be appreciated that the Detailed Description section, and not the Abstract of the Disclosure, is intended to be used to interpret the claims. The Abstract of the Disclosure may set forth one or more, but not all, exemplary embodiments of the invention, and thus, is not intended to limit the invention and the subjoined Claims in any way.

It will be apparent to those skilled in the relevant art(s) that various changes in form and detail can be made therein without departing from the spirit and scope of the invention. Thus the invention should not be limited by any of the above-described exemplary embodiments, but should be defined only in accordance with the subjoined Claims and their equivalents.

What is claimed is:

1. A method of forming a plurality of transistor device types on an integrated circuit, the transistors having a gate disposed over a semiconductive channel, comprising:
    doping selected portions of a wafer to form a first plurality of wells of a first conductivity type;
    doping selected portions of the first plurality of wells to form a first plurality of screen layers of the first conductivity type, the screen layers being disposed closer to a surface of the wafer than the wells;
    doping selected portions of the first plurality of screen layers to introduce diffusion-inhibiting dopant species;
    growing a substantially undoped epitaxial layer over the screen layer to a defined thickness and uniformity;
    out-diffusing dopants from the screen layer into the epitaxial layer to result in discrete threshold voltage devices by way of a thermal cycling process to result in defined degrees of out-diffusion of dopants that are differentiated by distance of dopant mitigation toward the gate; and
    forming an anti-punchthrough layer between at least one of the first plurality of wells and at least one of the first plurality of screen layers that overlies the at least one of the first plurality of wells;
    wherein the anti-punchthrough layer has a doping concentration greater than a doping concentration of the at least one well, and less than a doping concentration of the overlying screen layer.

2. A method of forming a plurality of transistor device types on an integrated circuit, the transistors having a gate disposed over a semiconductive channel, comprising:
    doping selected portions of a wafer to form a first plurality of wells of a first conductivity type;
    doping selected portions of the first plurality of wells to form a first plurality of screen layers of the first conductivity type, the screen layers being disposed closer to a surface of the wafer than the wells;
    doping selected portions of the first plurality of screen layers to introduce diffusion-inhibiting dopant species;
    growing a substantially undoped epitaxial layer over the screen layer to a defined thickness and uniformity; and
    out-diffusing dopants from the screen layer into the epitaxial layer to result in discrete threshold voltage devices by way of a thermal cycling process to result in defined degrees of out-diffusion of dopants that are differentiated by distance of dopant migration toward the gate;
    wherein differentially out-diffusing dopants forms at least a first channel region having a first thickness and a second channel region having a second thickness, and the first and second thicknesses are different.

3. The method of claim 2, wherein the first thickness is less than the second thickness, and the screen layer underlying the first channel region includes a greater concentration of dopants having a relatively high diffusivity than the screen layer underlying the second channel region.

4. A method of forming a plurality of transistor device types on an integrated circuit, the transistors having a gate disposed over a semiconductive channel, comprising:
    doping selected portions of a wafer to form a first plurality of wells of a first conductivity type;
    doping selected portions of the first plurality of wells to form a first plurality of screen layers of the first conductivity type, the screen layers being disposed closer to a surface of the wafer than the wells;
    doping selected portions of the first plurality of screen layers to introduce diffusion-inhibiting dopant species;
    growing a substantially undoped epitaxial layer over the screen layer to a defined thickness and uniformity;
    out diffusing dopants from the screen layer into the epitaxial layer to result in discrete threshold voltage devices by way of a thermal cycling process to result in defined degrees of out-diffusion of dopants that are differentiated by distance of dopant migration toward the gate; and
    forming a threshold voltage setting layer above the screen layer and below the surface of the epitaxial layer.

5. A method of forming a plurality of transistor device types on an integrated circuit, the transistors having a gate disposed over a semiconductive channel, comprising:
    doping selected portions of a wafer to form a first plurality of wells of a first conductivity type;
    doping selected portions of the first plurality of wells to form a first plurality of screen layers of the first conductivity type, the screen layers being disposed closer to a surface of the wafer than the wells;
    doping selected portions of the first plurality of screen layers to introduce diffusion-inhibiting dopant species;
    growing a substantially undoped epitaxial layer over the screen layer to a defined thickness and uniformity;
    out-diffusing dopants from the screen layer into the epitaxial layer to result in discrete threshold voltage devices by way of a thermal cycling process to result in defined degrees of out-diffusion of dopants that are differentiated by distance of dopant migration toward the gate; and
    performing a halo implant into predetermined portions of the epitaxial layer.

6. A method of making a System on Chip integrated circuit, comprising:
    forming a plurality of transistor device types on a die; and
    interconnecting predetermined ones of the plurality of transistor device types to form a plurality of circuit blocks;

wherein forming the plurality of transistor device types comprises:

forming transistor channel regions having different electrical characteristics by differentially out-diffusing dopants into a common epitaxial layer from an underlying screen layer, the screen layer having a plurality of compositionally different regions.

7. The method of claim 6, wherein at least a portion of the plurality of compositionally different regions of the screen layer are provided with different amounts of material to reduce dopant migration into the epitaxial layer.

8. The method of claim 6, wherein at least a portion of the plurality of compositionally different regions of the screen layer are provided with different amounts of a dopant of a first conductivity type.

9. The method of claim 6, wherein a first portion of the plurality of compositionally different regions of the screen layer are provided with a dopant of a first conductivity type and a first diffusivity, and a second portion of the plurality of compositionally different regions of the screen layer are provided with a dopant of a first conductivity type and a second diffusivity.

10. The method of claim 6, further comprising forming shallow trench isolation structures subsequent to forming the epitaxial layer.

11. An integrated circuit, comprising:

a plurality of n-channel field effect transistors (NFETs) and a plurality of p-channel field effect transistors (PFETs) all having channel regions disposed in a commonly formed epitaxial layer;

a screen layer underlying the epitaxial layer, the screen layer having a plurality of regions with different doping profiles;

a first portion of the plurality of NFETs having a first set of electrical characteristics and a second portion of the plurality of NFETs having a second set of electrical characteristics that are different from the first set of electrical characteristics; and a first portion of the plurality of PFETs having a third set of electrical characteristics and a second portion of the plurality of PFETs having a fourth set of electrical characteristics that are different from the third set of electrical characteristics;

wherein the difference between the first and second sets of electrical characteristics are related to the different doping profiles of the respective underlying regions of the screen layer, and the difference between the third and fourth sets of electrical characteristics are related to the different doping profiles of the respective underlying regions of the screen layer.

12. The integrated circuit of claim 11, wherein a first portion of the plurality of regions includes a higher concentration of dopants having a relatively high diffusivity than a second portion of the plurality of regions.

13. The integrated circuit of claim 12, wherein the channel regions overlying the first portion of the plurality of regions are thinner than the channel regions overlying the second portion of the plurality of regions.

14. The integrated circuit of claim 11, wherein a first portion of the plurality of regions includes a lower concentration of migration suppressing elements than a second portion of the plurality of regions.

15. The integrated circuit of claim 13, wherein the channel regions overlying the first portion of the plurality of regions are thinner than the channel regions overlying the second portion of the plurality of regions.

\* \* \* \* \*